United States Patent
Suh et al.

(10) Patent No.: US 7,253,088 B2
(45) Date of Patent: Aug. 7, 2007

(54) STRESS-RELIEF LAYERS AND STRESS-COMPENSATION COLLARS WITH LOW-TEMPERATURE SOLDERS FOR BOARD-LEVEL JOINTS, AND PROCESSES OF MAKING SAME

(75) Inventors: Daewoong Suh, Phoenix, AZ (US); Saikumar Jayaraman, Chandler, AZ (US); Stephen E. Lehman, Chandler, AZ (US); Mitesh Patel, Phoenix, AZ (US); Tiffany A. Byrne, Chandler, AZ (US); Edward L. Martin, Chandler, AZ (US); Mohd Erwan B. Basiron, Pulau Pinang (MY); Wei Keat Loh, Penang (MY); Sheau Hooi Lim, Pulau Penang (MY); Yoong Tatt P. Chin, Penang (MY)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 10/954,999

(22) Filed: Sep. 29, 2004

(65) Prior Publication Data

US 2006/0068579 A1    Mar. 30, 2006

(51) Int. Cl.
*H01L 21/44*    (2006.01)

(52) U.S. Cl. .............................. 438/612; 257/E21.508
(58) Field of Classification Search ................ 438/108, 438/612; 257/E21.508
See application file for complete search history.

(56) References Cited

U.S. PATENT DOCUMENTS

2002/0185309 A1* 12/2002 Imamura et al. ............ 174/261
2003/0214036 A1* 11/2003 Sarihan et al. .............. 257/738

* cited by examiner

*Primary Examiner*—Bradley K. Smith
(74) *Attorney, Agent, or Firm*—Schwegman, Lundberg, Woessner & Kluth P.A.

(57) ABSTRACT

A stress-relief layer is formed by dispensing a polymer upon a substrate lower surface under conditions to partially embed a low melting-point solder bump that is disposed upon the lower surface. The stress-relief layer flows against the low melting-point solder bump. A stress-compensation collar is formed on a board to which the substrate is mated, and the stress-compensation collar partially embeds the low melting-point solder bump. An article that exhibits a stress-relief layer and a stress-compensation collar is also included. A computing system that includes the low melting-point solder, the stress-relief layer, and the stress-compensation collar is also included.

12 Claims, 12 Drawing Sheets

STRESS-RELIEF LAYERS AND STRESS-COMPENSATION COLLARS WITH LOW-TEMPERATURE SOLDERS FOR BOARD-LEVEL JOINTS, AND PROCESSES OF MAKING SAME

TECHNICAL FIELD

Disclosed embodiments relate to a stress-relief layer and a stress-compensation collar that surround a low melting-point solder in a microelectronic device package.

BACKGROUND INFORMATION

Chip packaging is often intensely involved with heat removal. Thermal expansion-mismatch challenges exist between the die, the underfill material, and the substrate to which the die is mounted, and to connecting structures such as the motherboard. The thermal mismatch often is exhibited at the joint of a solder bump and its bond pad.

One challenge with chip packaging technology is premature solder joint failure due to thermal stress. Future packaging technology especially in the chipset application, will drive finer pitch as package size shrinks. With miniaturization of pitch, smaller ball size poses an increasing challenge to solder joint performance.

Two types of failure have been observed in solder bumps. One type is fatigue due to thermal stressing at the solder joint. Another type of failure results from mishandling the packages during processing, assembly, and transportation. These failures are primarily due to higher stress levels at the solder bump-contact pad interface. The solder joint has been observed to crack at the edges, and due to poor adhesion of the bumps to the pad, the solder has been observed to break away from the pad.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or setting upon the surface only because it is illustrated as such, unless it is explicitly stated in the text.

Reference will now be made to the drawings wherein like structures may be provided with like reference designations. In order to show the structures of embodiments most clearly, the drawings included herein are diagrammatic representations of inventive articles. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
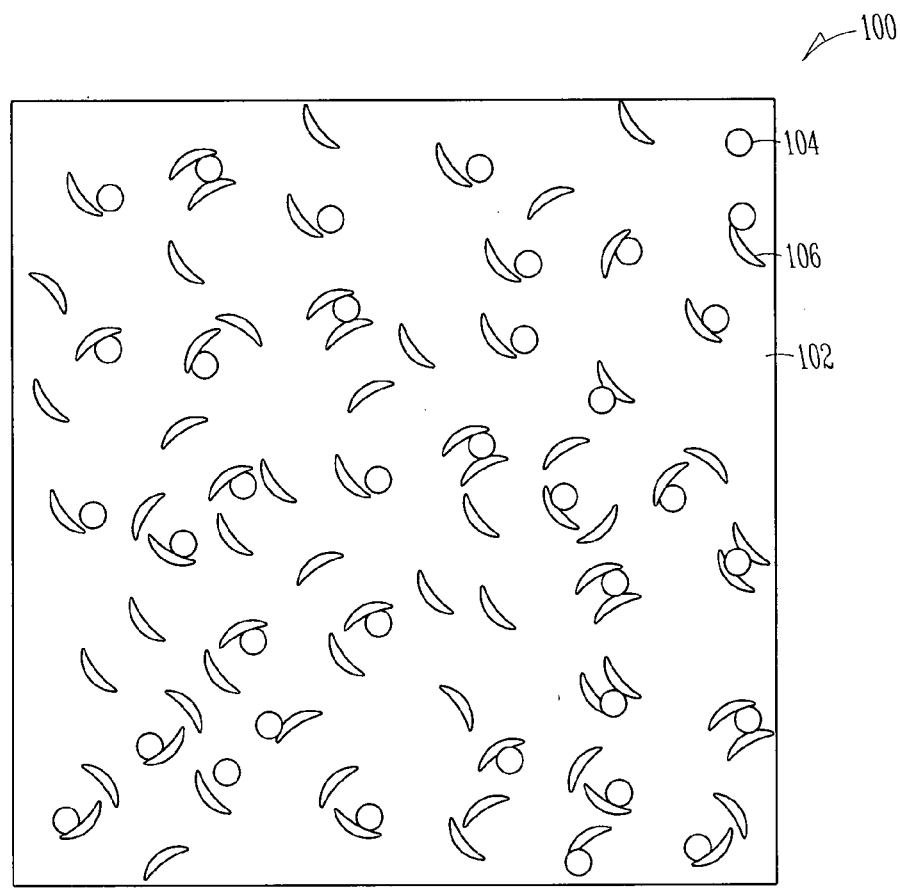
FIG. 1 is a cross-section of a solder composition according to an embodiment.

FIG. 1 is cross-section of a composition 100 according to an embodiment. In an embodiment, the composition 100 includes a tin-containing solder 102. In an embodiment, the composition 100 includes a zinc-containing solder 102. The composition 100 has modifications in some embodiments, however, that make it a compound. In an embodiment, the solder 102 is a monophasic composition.

Various low melting-point solders are disclosed according to several embodiments. Table 1 provides a summary of example embodiment solders.

TABLE 1

Low Melting-Point Solder Embodiment Examples

| Example | Sn, % | In, % | Bi, % | Zn, % |
|---------|-------|-------|-------|-------|
| 1 | 42–19 | 0–25 | 58–56 | 0 |
| 1A | 19 | 25 | 56 | 0 |
| 1B | 42 | 0 | 58 | 0 |
| 1C | 29–32 | 11–15 | 57 | 0 |
| 2 | 48–20 | 52–48 | 0–32 | 0 |
| 2A | 42–26 | 52–48 | 10–22 | 0 |
| 2B | 36–32 | 51–49 | 14–18 | 0 |
| 3 | 0–19 | 33–25 | 67–56 | 0 |
| 3A | 5–14 | 31–27 | 64–59 | 0 |
| 3B | 8–11 | 30–28 | 62–61 | 0 |
| 4 | 0–20 | 67–48 | 33–32 | 0 |
| 4A | 5–15 | 62–53 | 33–32 | 0 |
| 4B | 8–12 | 59–56 | 33–32 | 0 |
| 5 | 48–46 | 52–54 | 0 | 0–2 |
| 5A | 47 | 53 | 0 | 1 |
| 6 | 0 | 32–33 | 66–67 | 0–1 |
| 6A | 0 | 32.5 | 66.5 | 1 |
| 7 | 0 | 33.4–52.2 | 66.3–47.4 | 0.3–0.4 |
| 7A | 0 | 38–48 | 60–50 | 0.3–0.4 |
| 8 | 0 | 52.2–66.8 | 47.4–32.7 | 0.4–0.5 |
| 8A | 0 | 58–60 | 45–37 | 0.4–0.5 |
| 9 | 0 | 66–66.8 | 32.7–34 | 0–0.5 |
| 9A | 0 | 66.8 | 32.7 | 0.5 |

In an embodiment, an indium-tin-bismuth first solder 102 is prepared. In this embodiment, the indium-tin-bismuth first solder 102 includes indium as a major component. In an embodiment, the indium-tin-bismuth first solder 102 includes indium in a range of about 36% to about 63% indium. A tin component is present in a range from about 28% to about 48% tin. The bismuth is present in a range from about 2% to about 26%.

In an embodiment, the indium-tin-bismuth first solder 102 includes indium in a range of about 41% to about 58% indium, the tin component is present in a range from about 34% to about 42%, and the bismuth component is present in a range from about 7% to about 19%. In an embodiment, the first solder 102 includes indium in a range of about 46% to about 53% indium, the tin component is present in a range from about 37% to about 39%, and the bismuth component is present in a range from about 12% to about 14%. In an embodiment, the first solder 102 includes about 49% indium, about 38% tin, and about 13% bismuth.

In an embodiment, the indium-tin-bismuth first solder 102 is prepared with at least one doping material. The at least one doping material is added to give the indium-tin-bismuth first solder 102 selected properties. In an embodiment, the indium-tin-bismuth first solder 102 is doped with about 1% or less of the at least one doping material. In an embodiment, the indium-tin-bismuth first solder 102 is doped with about 0.5% or less of the at least one doping material. In an embodiment, the indium-tin-bismuth first solder 102 is doped with about 0.1% or less of the at least one doping material.

In an embodiment, the at least one doping material includes zinc. In an embodiment, the at least one doping material is selected from titanium, zirconium, hafnium, and combinations thereof. In an embodiment, the at least one doping material is selected from yttrium, ytterbium, lanthanum, praseodymium, and combinations thereof. In an embodiment, the at least one doping material is selected from nickel, palladium, platinum, and combinations thereof. In an embodiment, the at least one doping material is selected from cobalt, rhodium, iridium, and combinations thereof. In an embodiment, the at least one doping material is selected from magnesium, manganese, iron and combinations thereof. In an embodiment, the at least one doping material is selected from copper, silver, gold, and combinations thereof.

In an embodiment, the at least one doping material includes zinc alone. In an embodiment, the at least one doping material includes silver alone. In an embodiment, the at least one doping material includes copper alone. Where the at least one doping material is present, the above-given concentrations of the first solders are adjustable proportionally by recalculating the percentages.

In an embodiment, the at least one doping material includes any two of zinc, silver, or copper. In an embodiment, the at least one doping material includes zinc and silver. In an embodiment, the at least one doping material includes zinc and silver with zinc as the major doping material. In an embodiment, the at least one doping material includes zinc and silver with silver as the major doping material.

In an embodiment, the at least one doping material includes zinc and copper. In an embodiment, the at least one doping material includes zinc and copper with zinc as the major doping material. In an embodiment, the at least one doping material includes zinc and copper with copper as the major doping material.

In an embodiment, the at least one doping material includes silver and copper. In an embodiment, the at least one doping material includes silver and copper with silver as the major doping material. In an embodiment, the at least one doping material includes silver and copper silver with copper as the major doping material.

In an embodiment, the at least one doping material includes all three doping materials of silver, copper, and zinc. In an embodiment, the at least one doping material includes all three doping materials with zinc as the majority doping material. In an embodiment, the at least one doping material includes all three doping materials with zinc as the majority doping material, and copper as the minority doping material. In an embodiment, the at least one doping material includes all three doping materials with zinc as the majority doping material, and silver as the minority doping material.

In an embodiment, the at least one doping material includes all three doping materials with zinc as the plurality doping material and copper as the minority doping material. In an embodiment, the at least one doping material includes all three doping materials with zinc as the plurality doping material and silver as the minority doping material.

By review of this disclosure, it will become apparent to one of ordinary skill in the art that combinations of zinc, silver, and copper are also preparable as doping materials in the indium-tin-bismuth solders, wherein silver is the doping material with the greatest presence, and zinc and copper are alternatively present with one of them in a lowest concentration. Similarly, the majority or plurality doping material may be complemented by equal concentrations of the two minority doping materials.

In an embodiment, the at least one doping material is supplied to the composition 100 by providing an atomized doping material in a particle size from about 0.1 micrometer (μm) to about 100 μm. The atomized doping material is blended into the composition 100 by mechanical alloying. In an embodiment, the mechanical alloying describes the blending action, but the atomized doping material is not substantially alloyed, but it is interstitial in the matrix of the first solder 110.

Figure 2:
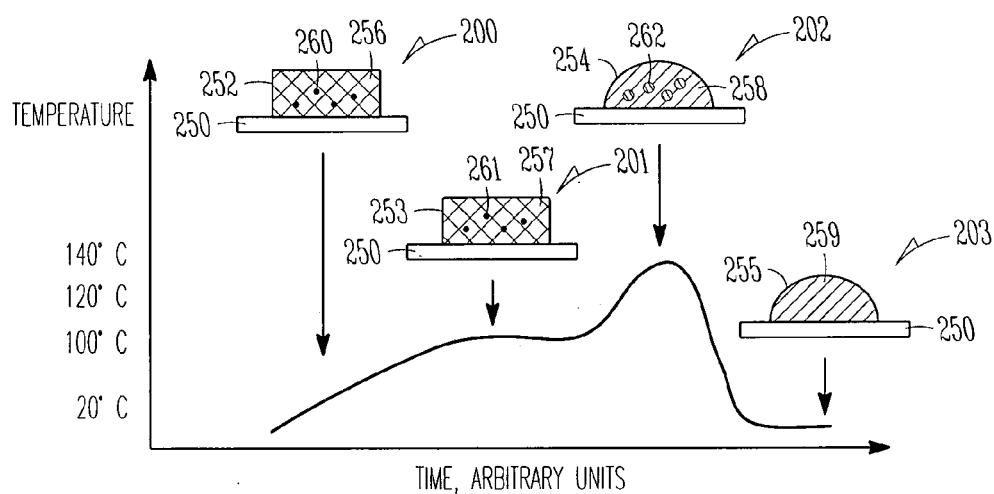
FIG. 2 is a process flow depiction of a solder during reflow according to an embodiment.

FIG. 2 is a process flow depiction of a solder paste mixture according to an embodiment. The process flow is depicted against a temperature-versus-time graphic to illustrate the state of the solder paste during processing. According to a process embodiment, the graphic ordinate depicts a room temperature of 20° C., a first ramp temperature of about 100° C., a flux activation temperature of about 120° C., a solder in situ alloying temperature of about 140° C., and a cooled solder temperature of 20° C. The abscissa depicts process time in arbitrary units.

In an embodiment, a process unit 200 includes a substrate 210 and a solder paste brick 212. Within the solder paste brick 212 is a solder paste matrix 216, which includes a solder mixture. In an embodiment, the solder mixture includes any solder as set forth in this disclosure.

The solder paste brick 212 also includes a discrete dispersion of the doping material according to any of the embodiments set forth in this disclosure. The doping material 220 is depicted within the solder paste brick 212 as four discrete particles for the purposes of illustration.

During processing, the solder paste brick 212 is heated during a ramp-up stage from room temperature to about 100° C. During further heating, the solder paste flux begins to activate. According to an embodiment, the process unit 201 is depicted as relating to the temperature of about 100° C. At about this temperature, the flux in the solder paste brick 213 begins to activate. The solder paste brick 213 is arbitrarily depicted with softening corners during flux activation. The solder paste matrix 217 is changing chemically during this process as the flux is activating and the solder mixture begins to soften. According to an embodiment, the discrete dispersion of the doping material 221 is not changed to the same degree as the solder mixture.

According to an embodiment, the process unit 202 is depicted as relating to the temperatures from about 120° C. to about 140° C. during the heating portion of the reflow process. At about this temperature range, the flux in the solder paste brick 214 has activated and the solder mixture in the solder paste matrix 218 is melted. The solder paste brick 214 is depicted arbitrarily with a substantially rounded profile. Additionally, the doping material 222 is depicted as enlarging while intermingling within the solder matrix 218 during the in situ alloying of the doping material 221 into the solder mixture.

According to an embodiment, the process unit 203 is depicted as relating to the temperatures from about 140° C. to about 20° C. during cool-down of the unit. At about this temperature range, the flux in the solder bump 215 has been substantially driven from the matrix 219. The solder bump 215 is depicted arbitrarily with a substantially rounded profile. Additionally, the doping material is depicted as substantially dispersed and alloyed into the matrix 219.

In an embodiment, preparation of the solder paste brick 212 is carried out by a non-alloying blending of components of the solder paste matrix 216. In an embodiment, the blending process is carried out in a conventional kneading device.

In an embodiment, during blending of the composition of the solder mixture, the paste including flux, and the doping material, no significant mechanical or chemical alloying occurs between the solder mixture and the doping material.

As depicted in FIG. 2, after the doping material powder particles are discretely dispersed into the solder paste, the solder paste is printed via an automated stencil print process and takes the form of the brick 212. As set forth herein, flux in the solder paste reacts chemically at increasing temperatures to release acids that reduce metal-oxides that are present. As the temperature reaches and surpasses the liquidus temperature of the solder mixture, the powder particles of the doping material(s) in the solder paste liquefy and alloy in situ. As depicted with the process unit 202, the matrix 218 coalesces and takes the form of a hemisphere. Simultaneously, the matrix 218 reacts chemically with under-bump metallization in the substrate 210 to form a metallic bond. Additionally, the doping material powder diffuses into the molten solder, although the liquidus temperature of the doping material powder may not be reached. Upon cooling, the solder bump 215 solidifies at a temperature that is higher than the liquidus temperature of the solder that is depicted as part of the solder paste brick 212.

According to an embodiment, were the solder bump 215 to be reheated, the in situ-formed solder alloy would liquefy at a higher temperature than it did upon its first reflow, due to a change in composition from the in situ alloying process.

Reference is again made to FIG. 1. Prior to the in situ alloying process, if it is used according to an embodiment, a particulate can be dispersion-filled into the solder 100.

In an embodiment, the first solder 102 includes a first particulate 104 that is dispersed within the matrix of the first solder 102. The first particulate 104 is a second-phase component in the solder 102 that adds selected properties to the alloy. In an embodiment, the particulate occupies a volume in the composition in a range from about 0.1% to about 50%.

In an embodiment, the first particulate 104 is an inorganic dielectric material such as an oxide. Various oxides can be used for the inorganic dielectric material, such as alumina, thoria, titania (whether rutile or anatase), urania, zirconia, ceria, and combinations thereof. In an embodiment, the first particulate 104 is a carbide material such as tungsten carbide. In an embodiment, the first particulate 104 is a carbon-based structure such as graphite, a Fullerene, and combinations thereof. In an embodiment, the first particulate 104 is an intermetallic dispersion material such as $Cu_6Sn_5$, $Cu_3Sn$, $Ni_3Sn_4$, or the like, other intermetallics, and combinations thereof. In an embodiment, the first particulate 104 is a silicide material that approaches the coefficient of thermal expansion (CTE) of silicon, such as titanium silicide. In an embodiment, the first particulate 104 is a material selected from at least two of the above-enumerated materials or the like. In an embodiment, the first particulate 104 is a material selected from at least three of the above-enumerated materials or the like. In an embodiment, the first particulate 104 is a material selected from at least four of the above-enumerated materials or the like. In an embodiment, the first particulate 104 is a material selected from all of the above-enumerated materials or the like.

In an embodiment, preparation of the first particulate 104 is carried out by milling the first particulate 104 to a size distribution that is submicron. In an embodiment, the first particulate 104 has a size distribution that is 100% passing about 100 nanometer (nm). Milling of the first particulate 104 can be carried out in a high-energy ball mill such as a Fritsch Pulverisette 7, made by Fritsch, GmbH of Rudolstadt, Germany, and which can be obtained from Gilson Co. of Worthington, Ohio. Other milling equipment can be obtained to obtain submicron, and about 100 nm particulates.

In an embodiment, the first particulate 104 is milled in a tungsten carbide (WC) environment such as in a planetary ball mill that includes WC grinding balls as well as a WC vial. In a non-limiting example, graphite is milled under about 300 kPa Argon atmosphere, to form a nanoporous structure of a Fullerene. In a non-limiting example, alumina ($Al_2O_3$) is milled under about 300 kPa Argon atmosphere, to form a 100% passing 100 nm distribution.

FIG. 1 also illustrates the presence of two particulates according to an embodiment. In an embodiment, the first particulate 104 is an inorganic dielectric, and a second particulate 106 is present in a second morphology such as a fiber or a shattered structure. In an embodiment, the second particulate 106 includes a Fullerene that has an elongated structure. In an embodiment, the particulate material is selected from at least two of the above-enumerated materials or the like. In an embodiment, the particulate material is selected from at least three of the above-enumerated materials or the like. In an embodiment, the particulate material is a material selected from at least four of the above-enumerated materials or the like. In an embodiment, the particulate material is a material selected from all of the above-enumerated materials or the like.

Although FIG. 1 illustrates the distribution of at least the first particulate 102 as discretely isolated in the matrix of the tin alloy 102, in an embodiment, the first particulate 104 is present as a reticulated structure. In an embodiment where the first particulate 104 is a Fullerene, it is similarly a reticulated structure that is dispersed in the matrix of the tin alloy 102, and therefore is substantially touching neighboring particulates.

After preparation of at least one particulate such as the first particulate 104, the first particulate 104 (and the second particulate 106 if present) is blended into the matrix of the solder 102. In an embodiment, blending of the particulate(s) is carried out according to known technique, such that agglomeration of the particulate(s) is minimized. Such techniques can include conventional mechanical alloying equipment.

Although the shapes for the first particulate 104 and the second particulate 106 are respectively depicted as round and irregular, these shapes are depicted to distinguish the two particulate types.

FIG. 1 also illustrates the presence of two particulates according to an embodiment. In an embodiment, the first particulate 104 is a second-phase dispersiod as set forth above, and the second particulate 106 is the doping material prior to in situ alloying as set forth above.

Reference is again made to FIG. 1. In an embodiment, a bismuth-tin-indium second solder 102 includes bismuth as a major component. In an embodiment, the bismuth-tin-indium second solder 102 includes bismuth in a range of about 42% to about 62% bismuth. The tin component is present in a range from about 19% to about 42% tin. The bismuth-tin-indium second solder 102 also includes indium. The indium is present in a range from about 7% to about 28%.

In an embodiment, the bismuth-tin-indium second solder 102 includes bismuth in a range from about 46% to about 57% bismuth, the tin component is present in a range from about 24% to about 38%, and the indium component is present in a range from about 11% to about 24%. In an embodiment, the bismuth-tin-indium second solder 102 includes bismuth in a range of about 52% to about 54% bismuth, the tin component is present in a range from about 29% to about 33%, and the indium component is present in a range from about 15% to about 19%. In an embodiment, the bismuth-tin-indium second solder 102 includes about 52% bismuth, about 31% tin, and about 17% indium.

In an embodiment, the bismuth-tin-indium second solder 102 is prepared with at least one doping material. The at least one doping material is added to give the bismuth-tin-indium second solder 102 selected properties. In an embodiment, the bismuth-tin-indium second solder 102 is doped with about 1% or less of the at least one doping material. In an embodiment, the bismuth-tin-indium second solder 102 is doped with about 0.5% or less of the at least one doping material. In an embodiment, the bismuth-tin-indium second solder 102 is doped with about 0.1% or less of the at least one doping material.

In an embodiment, the at least one doping material for the bismuth-tin-indium second solder 102 includes silver alone. In an embodiment, the at least one doping material includes antimony alone. In an embodiment, the at least one doping material includes copper alone. Where the at least one doping material is present, the above-given concentrations of the bismuth-tin-indium second solder 102 are adjustable proportionally by recalculating percentages.

In an embodiment, the at least one doping material includes any two of silver, antimony, or copper. In an embodiment, the at least one doping material includes silver and antimony. In an embodiment, the at least one doping material includes silver and antimony with silver as the major doping material. In an embodiment, the at least one doping material includes silver and antimony with antimony as the major doping material.

In an embodiment, the at least one doping material includes silver and copper. In an embodiment, the at least one doping material includes silver and copper with silver as the major doping material. In an embodiment, the at least one doping material includes silver and copper with copper as the major doping material.

In an embodiment, the at least one doping material includes antimony and copper. In an embodiment, the at least one doping material includes antimony and copper with antimony as the major doping material. In an embodiment, the at least one doping material includes antimony and copper antimony with copper as the major doping material.

In an embodiment, the at least one doping material includes all three above-mentioned doping materials. In an embodiment, the at least one doping material includes all three doping materials with silver as the majority doping material. In an embodiment, the at least one doping material includes all three doping materials with silver as the majority doping material, and copper as the minority doping material. In an embodiment, the at least one doping material includes all three doping materials with silver as the majority doping material, and antimony as the minority doping material.

In an embodiment, the at least one doping material includes all three doping materials with silver as the plurality doping material and copper as the minority doping material. In an embodiment, the at least one doping material includes all three doping materials with silver as the plurality doping material and antimony as the minority doping material.

By review of this disclosure, it will become apparent to one of ordinary skill in the art that combinations of silver, antimony, and copper are also preparable as doping materials in the bismuth-tin-indium solders, wherein antimony is the doping material with the greatest presence, and silver and copper are alternatively present with one of them in a lowest concentration. Similarly, the majority or plurality doping material may be complemented by equal concentrations of the two minority doping materials.

In an embodiment, the second solder 102 includes any first particulate 104 that is set forth in this disclosure. In an embodiment, the second solder 102 includes any combination of a first particulate 104 and a second particulate 106 that is set forth in this disclosure.

In an embodiment, the at least one doping material can be added prior to effecting the dispersion of the particulate if it is present. In an embodiment, the at least one doping material can be mechanically blended into the second solder 102 for in situ alloying as set forth and illustrated in FIG. 2. In an embodiment, neither the particulate nor the doping material is present in the second solder 102.

Figure 3A:
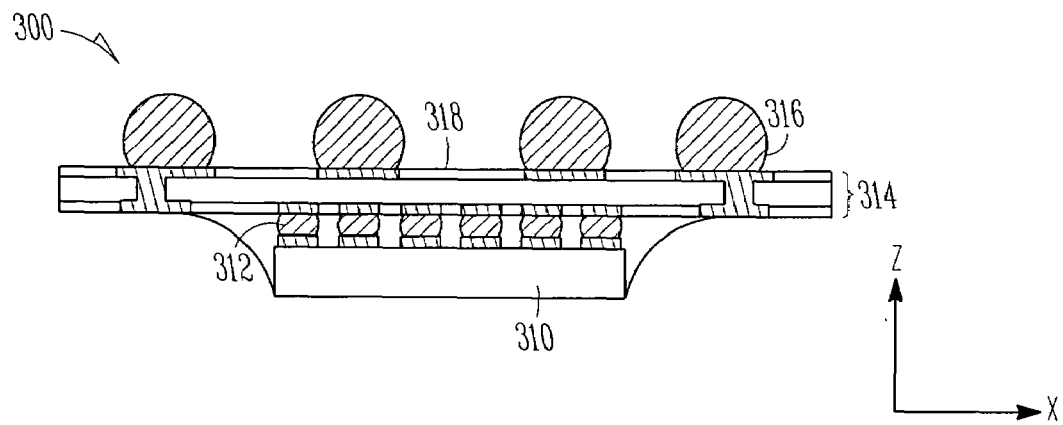
FIG. 3A is a cross-section of a chip package during processing according to an embodiment.

FIG. 3A is a cross-section of a chip package during processing according to an embodiment. The chip package 300 includes a die 310 that is coupled through a plurality of die solder bumps, one of which is designated with the reference numeral 312. In an embodiment, the die solder bump includes any of the solders set forth in this disclosure.

In an embodiment, the chip package 300 includes chip-scale packaging dimensions. By "chip-scale packaging dimensions", it is meant that the footprint of the chip package 300 is in a range from about 120% the largest characteristic dimension of the die 310, to about 200% the largest characteristic dimension of the die 310. Where the die 310 is substantially square, the largest characteristic dimension is an edge of the die 310.

Only six die solder bumps 312 are depicted for clarity of illustration. The die solder bump 312 couples the die 310 to a substrate 314, which is depicted as a laminated structure. The die solder bump 312 is disposed on the die side of the substrate 314.

In an embodiment, the substrate 314 is a second level substrate such as an interposer for a processor. In an embodiment, the substrate 314 is part of a printed wiring board (PWB) such as a main board. In an embodiment, the substrate 314 is part of a mezzanine PWB. In an embodiment, the substrate 314 is part of an expansion card PWB. In an embodiment, the substrate 314 is part of a small PWB such as a board for a handheld device such as a cell phone or a personal digital assistant (PDA). In an embodiment, the substrate 314 is the base board of a device such as a hand-held, and the stress-relief layer technology set forth in this disclosure is applied to the die solder bump 312.

In an embodiment the chip package 300 is also bumped on the land side 318 of the substrate 314 by a plurality of pre-attached solder first bumps, one of which is designated with the reference numeral 316. In an embodiment, the pre-attached solder first bumps 316 include any of the solders set forth in this disclosure.

Although only four solder first bumps 316 are depicted, the number is reduced for clarity of illustration. Where the expression "solder bump" or something enumerating a solder bump in a sequence is set forth, it is understood that it is an electrical coupling. Consequently, the term solder bump is synonymous with "electrical bump" where other electrical couplings can be interchanged with a solder coupling.

Figure 3B:
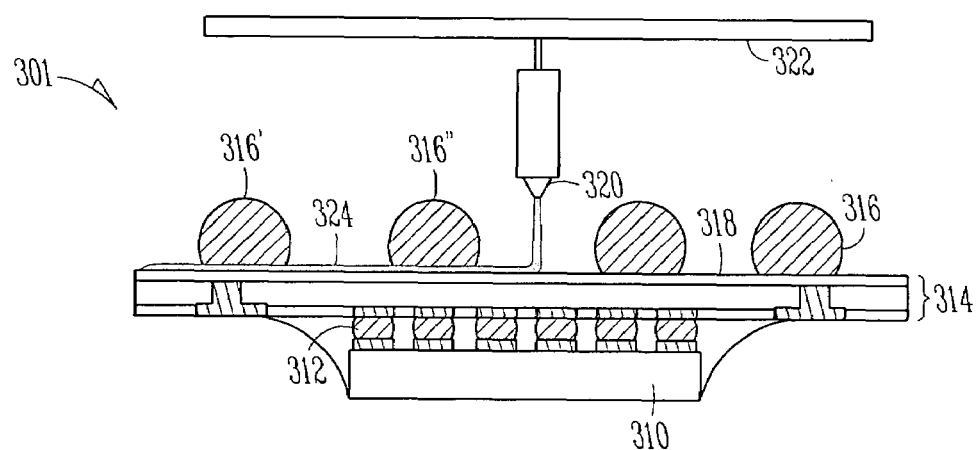
FIG. 3B is a cross-section of the chip package depicted in FIG. 3A during further processing according to an embodiment.

FIG. 3B is a cross-section of the chip package depicted in FIG. 3A during further processing according to an embodiment. The chip package 301 is depicted in connection with a dispenser 320 that is operated with an X-Y gantry 322 according to an embodiment. The dispenser 320 and the X-Y gantry 322 can be obtained from a commercial vendor such as Asymtek of Carlsbad, Calif. The dispenser 320 is depicted dispensing a substantially continuous stream of a mass such as a polymer underfill material 324 to partially embed the solder first bump 316 as a stress-relief layer (SRL) 324. In an embodiment, the dispenser 320 dispenses a substantially discrete series of a polymer underfill material (see FIGS. 6A, 8, and 9).

Various materials are used as the underfill material of the SRL 324, including resins according to an embodiment. In an embodiment, an epoxy is used. In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of all five of the compositions is used. Other polymer compositions can be used as the underfill material alone, or in combination with the enumerated polymer compositions.

In an embodiment, a polybenzoxazole composition is used by ejecting it onto the land side 318 in place, and by curing. In an embodiment, curing includes thermal curing the polymer(s). In an embodiment, curing includes cross-link curing the polymer(s). In an embodiment, curing includes cyclization curing the polymer(s). In an embodiment, curing includes at least two of the above curing operations.

In an embodiment, a prepolymer is in non-cyclized form as it is ejected onto the land side 318 before it is further processed, such as by heating to a temperature over its glass transition temperature ($T_G$). Upon heating, the prepolymer begins to cyclize and thereby cure, by reacting with functional groups nearby, and in the process by releasing water molecules. This cyclization changes the prepolymer from its non-cyclized state to its cyclized state, and to different properties that are exhibited between the two states.

In an embodiment, a stress-relief layer is a polybenzoxazole prepolymer that is synthesized by reacting di hydroxylamines with di acids, to form a hydroxyl amide. The hydroxyl amide is ejected onto the land side 318 of the substrate 314 and is heated by infrared (IR) heating, by microwave heating, or by a combination thereof. Other heating, such as conductive and/or convective heating, may be carried out. The heating process begins to convert the prepolymer to a closed-ring polybenzoxazole.

In an embodiment, the thermal stability of the SRL 324 exceeds about 450° C. Generally, the SRL 324 is substantially chemically inert and substantially insoluble after thermal processing. In an embodiment, the SRL 324 has a dielectric constant in a range from about 1 to about 3. In an embodiment, the SRL 324 has a dielectric constant of about 2.5.

In an embodiment, a poly (o-hydroxyamide) precursor is dissolved and ejected onto the land side 318 of the substrate 314 as an uncured SRL 324. The uncured SRL 324 is in a non-cyclized state. The TG of the hydroxyamide is also about 75 to 100° C. lower than when SRL 324 is further cured. The hydroxyamide is next cured to a temperature of about 75 to 100° C. higher than the uncured TG. Curing allows the SRL 324 to retain permanent features. During thermal processing, conversion of uncured polymer from a poly(hydroxyamide) to a fully cyclized poly benzoxazole SRL 324 occurs. The TG shifts upwardly to about 75 to 100° C. higher than the uncured SRL 324.

Figure 3C:
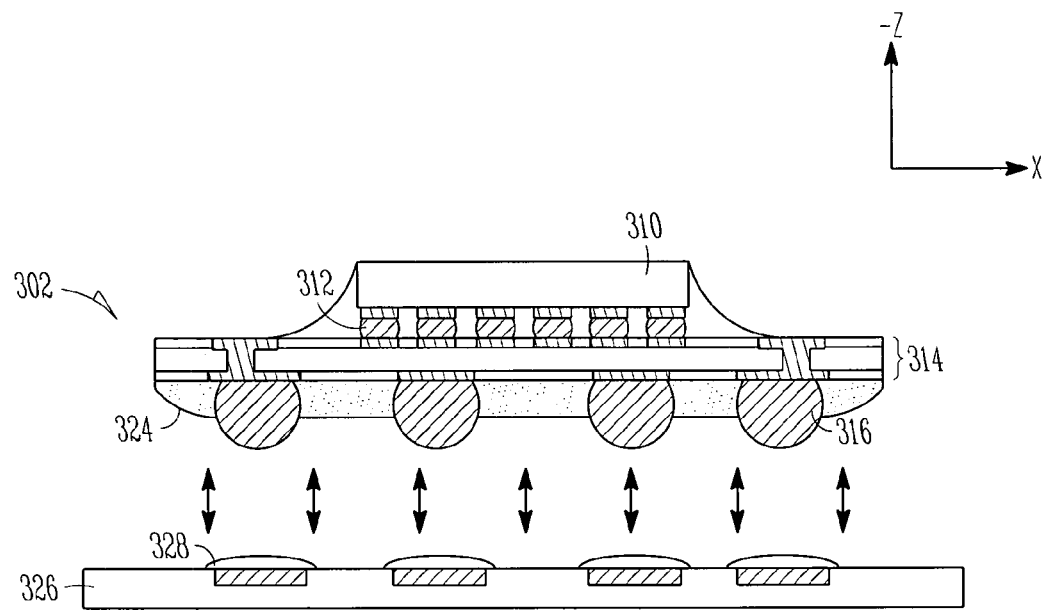
FIG. 3C is a cross-section of the chip package depicted in FIG. 3B during further processing according to an embodiment.

FIG. 3C is a cross-section of the chip package depicted in FIG. 3B during further processing according to an embodiment. The chip package 302 is being mated to a board 326. Processing depicted in FIG. 3C includes the substrate 314 having been inverted and being directed toward the board 326 as indicated by the directional arrows between the substrate 314 and the board 326.

In an embodiment, the board 326 is prepared with a plurality of pre-applied stress-compensation collar (SCC) precursor spots, one of which is designated with the reference numeral 328. The pre-applied SCC precursor spots 328 provide a stress-compensating structure to offset any stresses that are borne in the SRL 324 as stresses are transferred between the substrate 314 and the board 326.

In an embodiment, the pre-applied SCC precursor spots 328 include flux that reacts chemically at increasing temperatures to release acids that reduce metal-oxides that are present between the bond pad on the board 326 and the solder first bump 316.

Figure 3D:
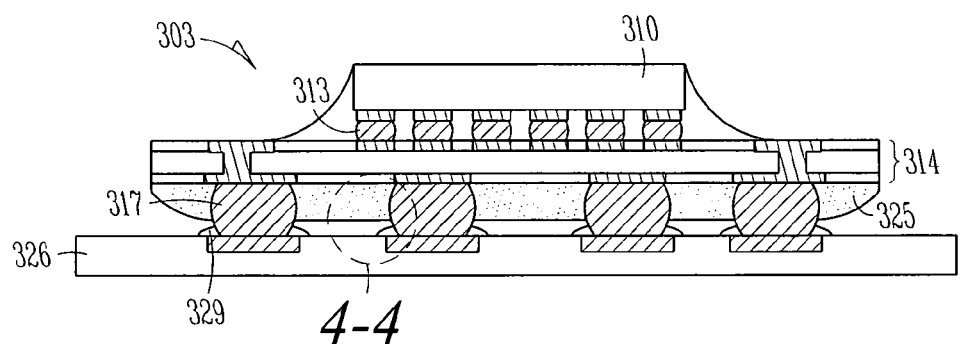
FIG. 3D is a cross-section of the chip package depicted in FIG. 3C during further processing according to an embodiment.

FIG. 3D is a cross-section of the chip package depicted in FIG. 3C during further processing according to an embodiment. The chip package 303 has been mated by assembling the die 310, and the substrate 314 onto which it is mounted, with the board 326. Assembly has been accomplished by pushing the solder first bumps 316 through the pre-applied SCC precursor spots 328 (FIG. 3C). Thereafter, the stress-compensation collar precursor spots 328 are depicted as a stress-compensation collar, one of which is designated as an SCC with the reference numeral 329.

After applying the substrate 314 to the board 326, the SRL 325 (SRL 324 in FIG. 3C, if it has not yet been processed) and the SCC 329 are cured by any curing process that is appropriate for the specific materials selected for the SCC 329. In an embodiment, prior to, following, or simultaneously with curing the SCC 329, reflowing of the solder first bumps 317 (solder first bumps 316 in FIG. 3C) is accomplished. Optionally, the die solder bumps 313 (die solder bumps 312 in FIG. 3C) are also reflowed simultaneously therewith.

Figure 4:
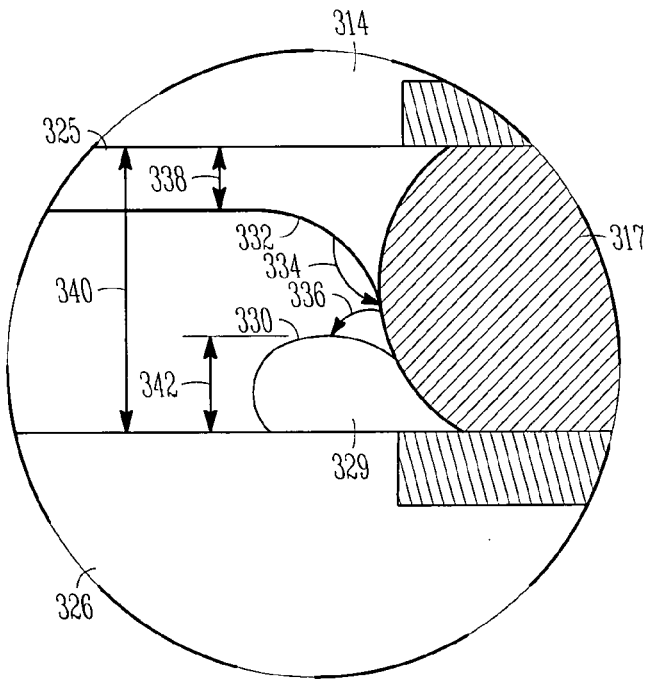
FIG. 4 is a detail section taken from FIG. 3D according to an embodiment.

FIG. 4 is a detail section taken from FIG. 3D according to an embodiment. The detail section 4-4 illustrates the topology of the chip package 303 at an occurrence of a solder first bump 317, the SRL 325, and the SCC 329. In an embodiment, the solder first bump 317 includes any solder as set forth in this disclosure.

Various metrics can be used to quantify the resulting structure that includes the solder first bump 317 in relation to the SCC 329.

Processing conditions dictate the respective surfaces in relation to the size of the solder first bump 317, and in relation to the wetting qualities of the respective SCC 329 and the SRL 325 upon the solder first bump 317 and neighboring structures such as the substrate 314 and the board 326. In an embodiment, the SCC 329 and the SRL 325 are depicted as having a non-wetting surface 330 and a fillet surface 332, respectively. In FIG. 2, the SRL 325 exhibits a higher degree of wetting upon the solder first bump 317 than that of the SCC 329. The contact angle 334 of the SRL 325 is depicted as obtuse. Contrariwise, the contact angle 336 of the SCC 329 upon the board 326 is depicted as acute. For the SCC 329 and the SRL 325, it can be appreciated that any combination of obtuse, right, and acute contact angles, including both contact angles being the same type, can be achieved according to process, design, and implementation considerations.

In an embodiment, the amount of the solder first bump 317 that is exposed below the fillet surface 332 is about seven-eighths or greater, as measured by the height 338 of the SRL 325, divided by the diameter 340 solder first bump 317. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 317 that is exposed above the non-wetting surface 330 is about seven-eighths or greater, measured by the SCC height 342, divided by the diameter 340. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the material of the SCC 329 includes an organic composition that includes a non-fugitive element in the composition. The non-fugitive element is calculated to remain and to compensate for stresses that are transferred from the substrate 314 to the board 326.

In an embodiment, the material of the SCC 329 includes an epoxy solder paste (ESP). By "epoxy" it is understood to be a thermoplastic or thermosetting composition that can be cured to perform under ordinary operating conditions required in chip packages. In an embodiment, the material of the SCC 329 includes an epoxy flux (EF). In an embodiment, the material of the SCC 329 includes combinations of ESP and EF.

In an embodiment, the material of the SCC 329 includes an EF that includes a resin-containing flux. In an embodiment, the EF includes a cyanate ester-containing flux. In an embodiment, the EF includes a polyimide-containing flux. In an embodiment, the EF includes a polybenzoxazole-containing flux. In an embodiment, the EF includes a polybenzimidazole-containing flux. In an embodiment, the EF includes a polybenzothiazole-containing flux. In an embodiment, the EF includes a combination of two of the EFs set forth herein. In an embodiment, the EF includes a combination of three of the EFs set forth herein. In an embodiment, the EF includes a combination of four of the EFs set forth herein. In an embodiment, the EF includes a combination of five of the EFs set forth herein. In an embodiment, the EF includes a combination of all of the EFs set forth herein.

In an embodiment, the material of the SCC 329 includes an ESP that includes a paste. In an embodiment, the ESP includes a solder paste. In an embodiment, the ESP includes an epoxy-containing solder paste. In an embodiment, the ESP includes a resin-containing paste. In an embodiment, the ESP includes a cyanate ester-containing paste. In an embodiment, the ESP includes a polyimide-containing paste. In an embodiment, the ESP includes a polybenzoxazole-containing paste. In an embodiment, the ESP includes a polybenzimidazole-containing paste. In an embodiment, the ESP includes a polybenzothiazole-containing paste. In an embodiment, the ESP includes a combination of two of the ESPs set forth herein. In an embodiment, the ESP includes a combination of three of the ESPs set forth herein. In an embodiment, the ESP includes a combination of four of the ESPs set forth herein. In an embodiment, the ESP includes a combination of five of the ESPs set forth herein. In an embodiment, the ESP includes a combination of six of the ESPs set forth herein. In an embodiment, the ESP includes a combination of seven of the ESPs set forth herein.

Figure 5:
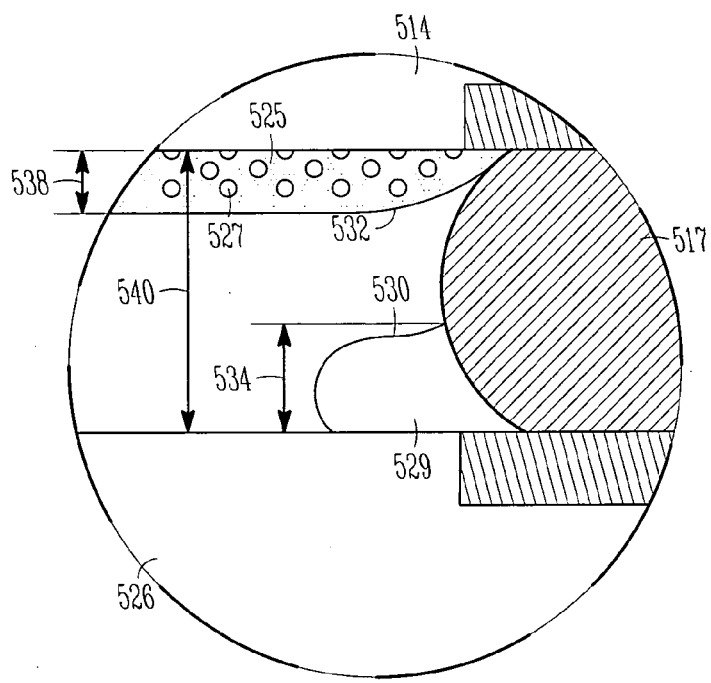
FIG. 5 is a detail section taken from FIG. 3D according to an embodiment.

FIG. 5 is a detail section taken from FIG. 3D according to an embodiment. The detail section 4-4 illustrates the topology of a chip package at an occurrence of a solder first bump 517, an SRL 525, and an SCC 529. In an embodiment, the solder first bump 517 includes any solder as set forth in this disclosure.

Various metrics can be used to quantify the resulting structure that includes the solder first bump 517 in relation to the SCC 529.

Processing conditions dictate the respective surfaces in relation to the size of the solder first bump 517, and in relation to the wetting qualities of the respective SCC 529 and the SRL 525 upon the solder first bump 517 and neighboring structures such as the substrate 514 and the board 526. In an embodiment, the SCC 529 and the SRL 525 are depicted as having a fillet surface 530 and a non-wetting surface 532, respectively. In FIG. 5, the SRL 525 exhibits a lower degree of wetting upon the solder first bump 517 than that of the SCC 529. For the SCC 529 and the SRL 525, it can be appreciated that any combination of obtuse, right, and acute contact angles, including both contact angles being the same type, can be achieved according to process, design, and implementation considerations.

In an embodiment, the amount of the solder first bump 517 that is exposed above the fillet surface 530 is about seven-eighths or greater, as measured by the SCC height 534 divided by the solder first bump 517 diameter 540. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 517 that is exposed below the non-wetting surface 532 is about seven-eighths or greater, measured by the SRL height 538, divided by the solder first bump 517 diameter 540. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

Additionally, the SRL 525 is filled with a particulate 527 that assists the SRL 525 to have a coefficient of thermal expansion (CTE) that facilitates a lower thermal mismatch between the SRL 525 and neighboring structures. In an embodiment, the particulate 527 is silica or the like. In an embodiment, the particulate 527 is ceria or the like. In an embodiment, the particulate 527 is zirconia or the like. In an embodiment, the particulate 527 is thoria or the like. In an embodiment, the particulate 527 is a combination of two or more particulates. Other dielectric particulates 527 may be used alone, or in combination with enumerated particulates.

In an embodiment, the particulate 527 is present in a range from about 1 percent to about one-half or greater the total weight of the SRL 525 after it has been fully cured for field use. In an embodiment, the particulate 527 is in a range from about 2 percent to about 30 percent. In an embodiment, the particulate 527 is in a range from about 5 percent to about 25 percent. In an embodiment, the particulate 527 is in a range from about 10 percent to about 20 percent.

The coefficient of thermal expansion (CTE) of the SRL 525 is alterable by the presence and weight percent of the particulate 527. In an embodiment, the SRL 525 as filled with the particulate (hereinafer SRL 525) includes a composite CTE in a range from about 9 ppm/° C. to about 40 ppm/° C. In an embodiment, the SRL 525 includes a composite CTE in a range from about 15 ppm/° C. to about 35 ppm/° C. In an embodiment, the SRL 525 includes a composite CTE in a range from about 20 ppm/° C. to about 30 ppm/° C. The specific CTE can be selected within these ranges, or outside these ranges according to an application, and can be selected to balance adhesion of the SRL 525 to the substrate 514 and to provide stress-relieving qualities based upon a known thermal load under operating conditions of the die.

Figure 6A:
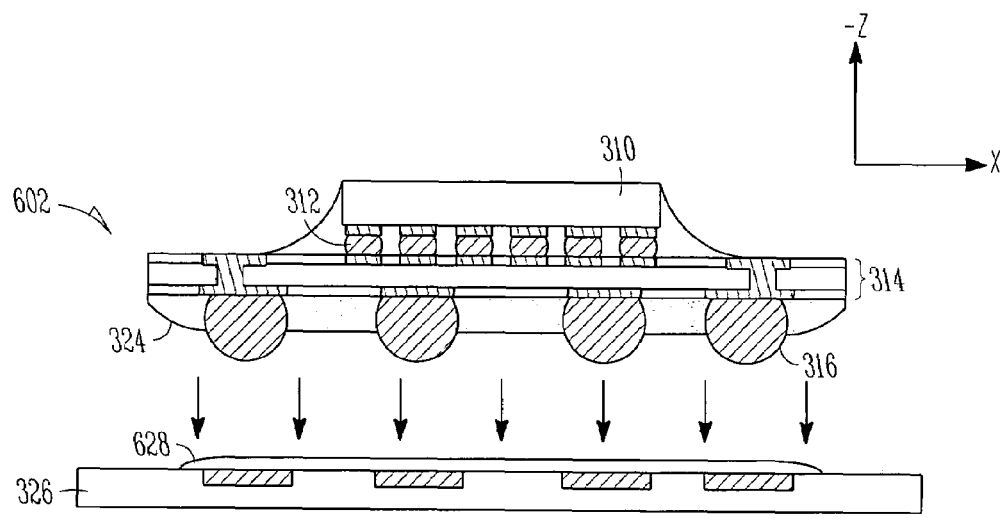
FIG. 6A is a cross-section of the chip package depicted in FIG. 3B during further processing according to an embodiment.

FIG. 6A is a cross-section of the chip package depicted in FIG. 3B during further processing according to an embodiment. The chip package 602 is being mated to the board 326. Processing depicted in FIG. 6A includes the substrate 314 having been inverted and being directed toward the board 326, as indicated by the directional arrows between the substrate 314 and the board 326.

In an embodiment, the board 326 is prepared with a pre-applied stress-compensation collar (SCC) precursor 628. The pre-applied SCC precursor 628 provides a stress-compensating structure to offset any stresses that are borne in the SRL 324 as stresses are transferred between the substrate 314 and the board 326.

In an embodiment, the pre-applied SCC precursor 628 includes a flux that reacts chemically at increasing temperatures to release acids that reduce metal-oxides that are present between the bond pad on the board 326 and the solder first bump 316.

Figure 6B:
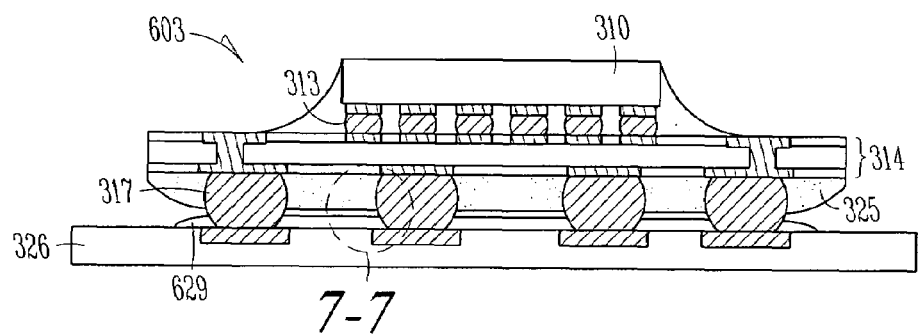
FIG. 6B is a cross-section of the chip package depicted in FIG. 6A during further processing according to an embodiment.

FIG. 6B is a cross-section of the chip package depicted in FIG. 6A during further processing according to an embodiment. The chip package 603 has been mated by assembling the die 310, and the substrate 314 onto which it is mounted, with the board 326. Assembly has been accomplished by pushing the solder first bumps 316 (FIG. 6A) through the pre-applied SCC precursor 628. Thereafter, the pre-applied SCC precursor 628 is depicted as a stress-compensation collar 629.

After applying the substrate 314 to the board 326, the SRL 325 (if it has not yet been processed) and the SCC 629 are cured by any curing process that is appropriate for the specific materials selected for the SCC 629. In an embodiment, prior to, following, or simultaneously with curing the SCC 629, reflowing of the solder first bumps 317 is accomplished. Optionally, the die solder bumps 313 are also reflowed simultaneously therewith.

Figure 7:
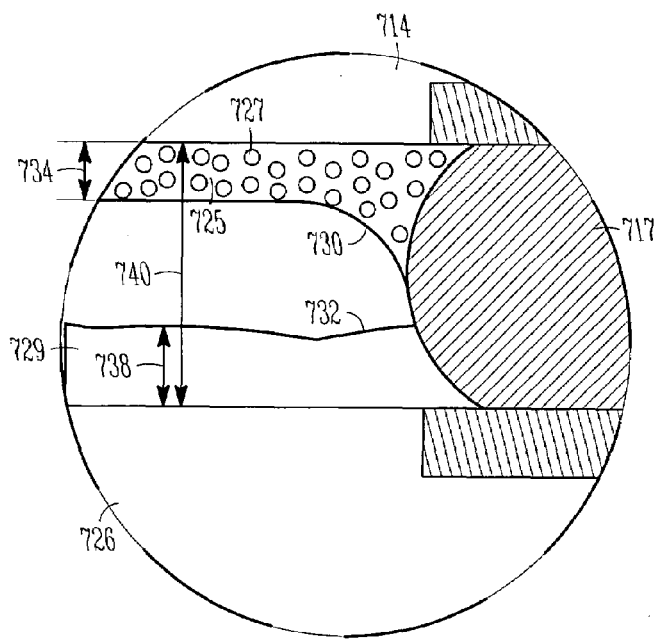
FIG. 7 is a detail section taken from FIG. 6B according to an embodiment.

FIG. 7 is a detail section taken from FIG. 6B according to an embodiment. The detail section 7-7 illustrates the topology of the chip package 603 at an occurrence of a solder first bump 717, an SRL 725, and an SCC 729. In an embodiment, the solder first bump 717 includes any solder as set forth in this disclosure. Various metrics can be used to quantify the resulting structure that includes the solder first bump 717 in relation to the SCC 729.

In an embodiment, the SCC 729 includes an organic composition that includes a non-fugitive element in the composition. The non-fugitive element is calculated to remain and to compensate for stresses that are transferred from the substrate 714 to the board 726.

In an embodiment, the material of the SCC 729 includes an ESP. In an embodiment, the material of the SCC 729 includes an EF. In an embodiment, the material of the SCC 729 includes combinations of ESP and EF.

In an embodiment, the material of the SCC 729 includes an EF that includes a resin-containing flux. In an embodiment, the EF includes a cyanate ester-containing flux. In an embodiment, the EF includes a polyimide-containing flux. In an embodiment, the EF includes a polybenzoxazole-containing flux. In an embodiment, the EF includes a polybenzimidazole-containing flux. In an embodiment, the EF includes a polybenzothiazole-containing flux. In an embodiment, the EF includes a combination of two of the EFs set forth herein. In an embodiment, the EF includes a combination of three of the EFs set forth herein. In an embodiment, the EF includes a combination of four of the EFs set forth herein. In an embodiment, the EF includes a combination of five of the EFs set forth herein. In an embodiment, the EF includes a combination of all of the EFs set forth herein.

In an embodiment, the material of the SCC 729 includes an ESP that includes a paste. In an embodiment, the ESP includes a solder paste. In an embodiment, the ESP includes an epoxy-containing solder paste. In an embodiment, the ESP includes a resin-containing paste. In an embodiment, the ESP includes a cyanate ester-containing paste. In an embodiment, the ESP includes a polyimide-containing paste. In an embodiment, the ESP includes a polybenzoxazole-containing paste. In an embodiment, the ESP includes a polybenzimidazole-containing paste. In an embodiment, the ESP includes a polybenzothiazole-containing paste. In an embodiment, the ESP includes a combination of two of the ESPs set forth herein. In an embodiment, the ESP includes a combination of three of the ESPs set forth herein. In an embodiment, the ESP includes a combination of four of the ESPs set forth herein. In an embodiment, the ESP includes a combination of five of the ESPs set forth herein. In an embodiment, the ESP includes a combination of six of the ESPs set forth herein. In an embodiment, the ESP includes a combination of seven of the ESPs set forth herein.

Processing conditions can influence the respective surfaces in relation to the size of the solder first bump 717, and in relation to the wetting qualities of the respective SCC 729 and the SRL 725 upon the solder first bump 717 and neighboring structures such as the substrate 714 and the board 726. In an embodiment, the SCC 729 and the SRL 725 are depicted as having a fillet surface 730 and a non-wetting surface 732, respectively. For the SCC 729 and the SRL 725, it can be appreciated that any combination of obtuse, right, and acute contact angles including both contact angles being the same type, can be achieved according to process, design, and implementation considerations.

In an embodiment, the amount of the solder first bump 717 that is exposed below the fillet surface 730 is about seven-eighths or greater, as measured by the SRL 725 height 734, divided by the solder first bump 717 diameter 740. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 717 that is exposed above the non-wetting surface 732 is about seven-eighths or greater, measured by the SRL height 738, divided by the solder first bump 717 diameter 740. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the SRL 725 is filled with a particulate 727 that assists the SRL 725 to have a CTE that facilitates a lower thermal mismatch between the SRL 725 neighboring structures. In an embodiment, the particulate 727 is silica or the like. In an embodiment, the particulate 727 is ceria or the like. In an embodiment, the particulate 727 is zirconia or the like. In an embodiment, the particulate 727 is thoria or the like. In an embodiment, the particulate 727 is a combination of two or more particulates. Other dielectric particulates 727 may be used, alone or in combination with enumerated particulates.

In an embodiment, the particulate 727 is present in a range from about 1 percent to about one-half or greater the total weight of the SRL 725 after it has been fully cured for field use. In an embodiment, the particulate 727 is in a range from about 2 percent to about 30 percent. In an embodiment, the particulate 727 is in a range from about 5 percent to about 25 percent. In an embodiment, the particulate 742 is in a range from about 10 percent to about 20 percent.

The CTE of the SRL 725 is alterable by the presence and weight percent of the particulate 727. In an embodiment, the SRL 725 as filled with the particulate 727 (hereinafer SRL 725) includes a composite CTE in a range from about 9 ppm/° C. to about 40 ppm/° C. In an embodiment, the SRL 725 includes a composite CTE in a range from about 15 ppm/° C. to about 35 ppm/° C. In an embodiment, the SRL 725 includes a composite CTE in a range from about 20 ppm/° C. to about 30 ppm/° C. The specific CTE can be selected within these ranges, or outside these ranges according to an application, and can be selected to balance adhesion of the SRL 725 to the substrate 714 and to provide stress-relieving qualities based upon a known thermal load under operating conditions of the die.

Figure 8A:
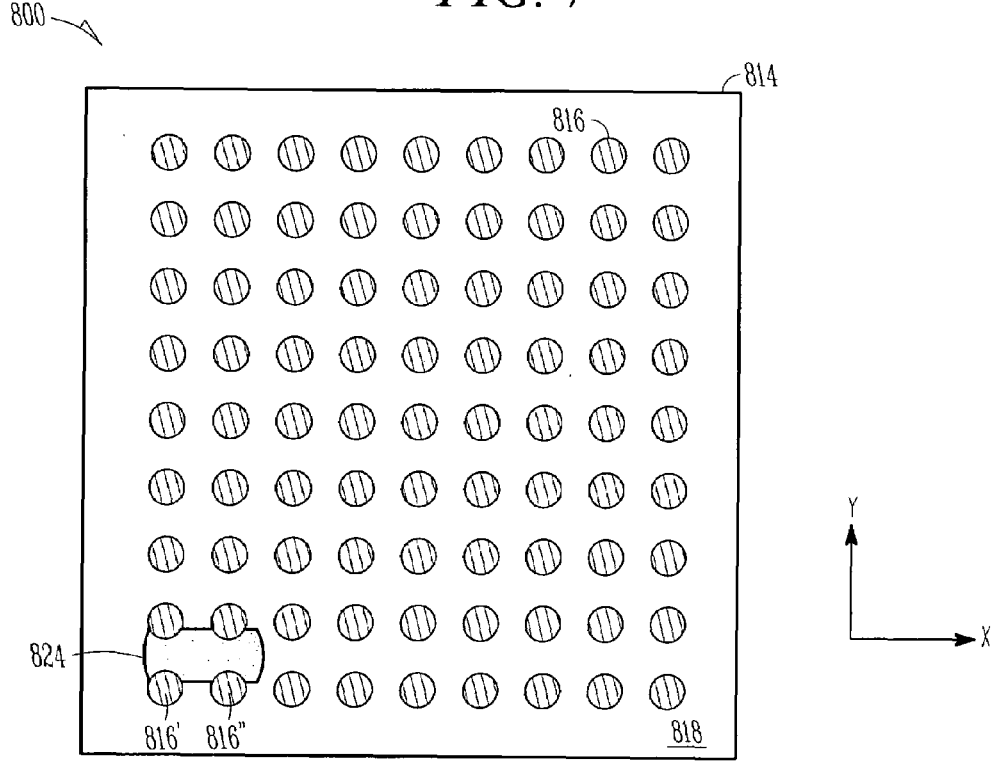
FIG. 8A is a plan of a chip package during processing according to an embodiment.

FIG. 8A is a plan of a chip package during processing according to an embodiment. The chip package 800 includes a die (not pictured) that is coupled through a plurality of die solder bumps on the land side thereof, one of which is designated with the reference numeral 816. In an embodiment, the solder first bump 816 includes any solder as set forth in this disclosure.

The solder first bump 816 of the chip package 800 is pushed through an SCC precursor according to any of the embodiments set forth in this disclosure.

In an embodiment, the substrate 814 is a second level substrate such as an interposer for a processor. In an embodiment, the substrate 814 is part of a PWB such as a main board. In an embodiment, the substrate 814 is part of a mezzanine PWB. In an embodiment, the substrate 814 is part of an expansion card PWB. In an embodiment, the substrate 814 is part of a small PWB, such as a board for a handheld device such as a cell phone or a PDA. In an embodiment, the die is represented as the substrate 814 and the land side 818 is represented as the active surface of the die 814 after appropriate metallization.

The land side 818 of the substrate 814 depicts a solder bump array that can also be referred to as a ball-grid array or the like. During processing, a dispenser (not pictured) deposits a substantially continuous stream of a mass for a stress-relief layer 824 that has made contact with a solder first bump 816' and a solder second bump 816". The solder first bump 816' and the solder second bump 816" are analogous to a solder first bump 316' and a solder second bump 316" as seen in FIG. 3B, while the dispenser 320 is operated with the X-Y gantry 322 to deposit the substantially continuous stream of the stress-relief layer 324.

In an embodiment, flow of the substantially continuous stream of an SRL 824 is carried out under conditions to cause the SRL 824 to at least partially flood around the solder first bump 816' and the solder second bump 816", such that the SRL 824 can substantially contact about half or more of the circumferences of the respective solder bumps.

Figure 8B:
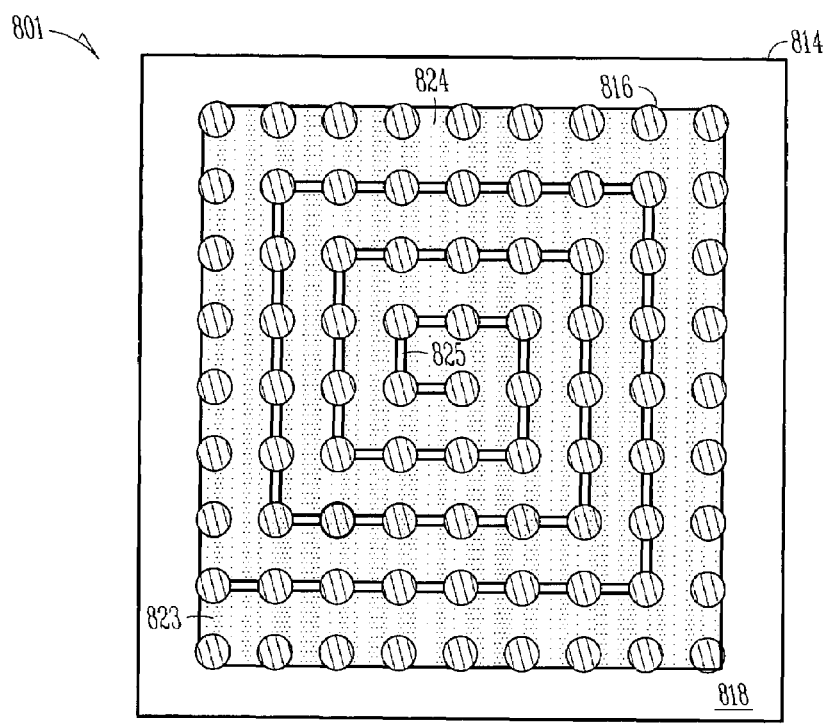
FIG. 8B is a plan of the chip package depicted in FIG. 8A during further processing according to an embodiment.

FIG. 8B is a plan of the chip package depicted in FIG. 8A during further processing according to an embodiment. After the dispenser (not pictured) has completed laying down a substantially continuous stream of the SRL 824 onto the land side, or lower surface 818 of the chip package 801, the SRL 824 includes an origin 823 where the dispenser began to eject the SRL 824 onto the substrate 814, and a terminus 825 where the dispenser stopped dispensing according to an embodiment. As depicted in FIG. 8B, a spiral pattern of the substantially continuous SRL 824 is laid down. In an embodiment, processing includes a higher flow rate along the peripheral solder bumps 816, such that the SRL 824 can substantially surround at least about half the circumferences of the peripheral solder bumps 816. Thereafter, the flow rate is decreased for the interior solder bumps 816. In an embodiment, the X-Y gantry translational speed is modified where the dispenser changes directions to cause substantially the same amount of SRL 824 to be metered while the X-Y gantry negotiates corners. In an embodiment, the X-Y gantry translational speed is not modified, but the flow rate of the dispenser is modified to be metered at different rates while the X-Y gantry negotiates corners. In any event, the amount of the SRL 824 that is metered to cover the solder first bumps 816 is an amount between about 5% and about 95% as set forth in this disclosure according to the various embodiments.

In an embodiment, other patterns can be achieved while forming the SRL 824. In an embodiment, a serpentine pattern can be dispensed where the solder bump count allows for a continuous stream of the SRL 824 to be metered onto the land side 818 of the substrate 814.

Figure 9A:
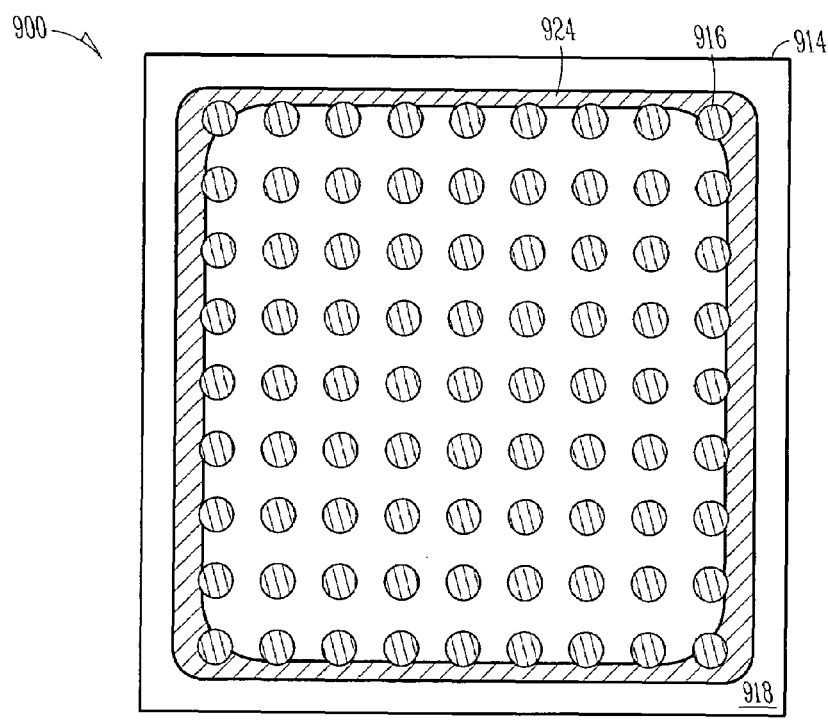
FIG. 9A is a plan of a chip package during processing according to an embodiment.

FIG. 9A is a plan of a chip package during processing according to an embodiment. The chip package 900 includes a die (not pictured) that is coupled through a plurality of solder bumps on the land side thereof, one of which is designated with the reference numeral 916. In an embodiment, the solder bump 916 includes any solder as set forth in this disclosure.

The land side 918 of the substrate 914 depicts a solder ball array. During processing a dispenser (not pictured) deposits a substantially continuous stream of a stress-relief layer 924 that forms a peripheral ring SRL 924 about the solder bumps 916.

Figure 9B:
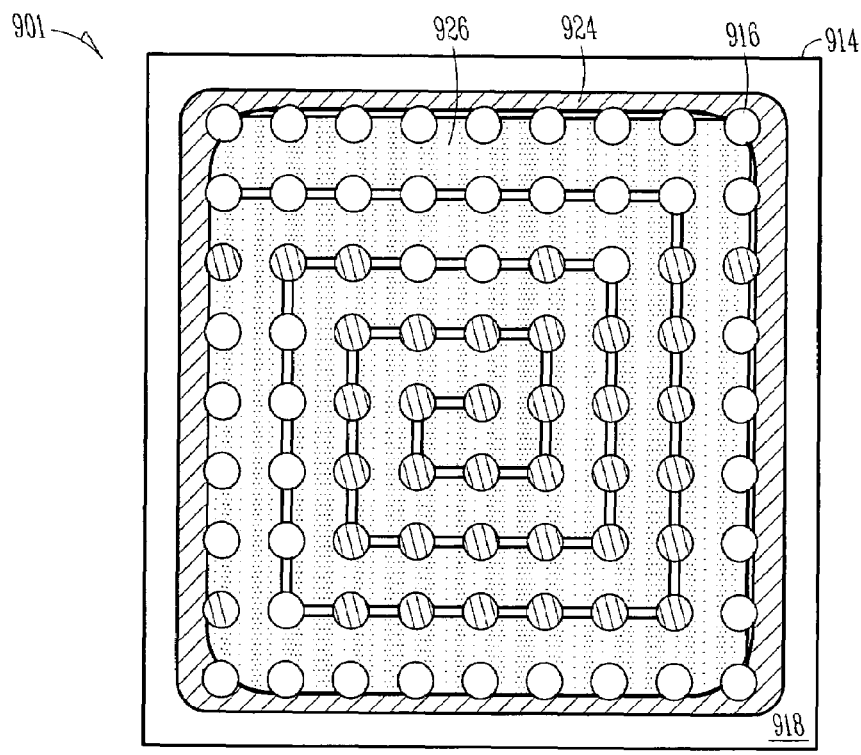
FIG. 9B is a plan of the chip package depicted in FIG. 9A during further processing according to an embodiment.

FIG. 9B is a plan of the chip package 900 depicted in FIG. 9A during further processing according to an embodiment. In connection with flow of the peripheral ring SRL 924, a spiral, substantially continuous SRL 926 is formed to make contact with substantially all of the solder bumps 916, including those contacted by the peripheral ring SRL 924.

In an embodiment, the peripheral ring SRL 924 and the substantially continuous SRL 926 are formed in a single, continuous dispensation of underfill material such that one pass of the X-Y gantry forms the peripheral ring SRL 924, whether it precedes, follows, or is formed simultaneously with the substantially continuous SRL 926. In any event, the amount of the underfill material is metered to cover the solder bumps 916 to an amount between about 5% and about 95% as set forth in this disclosure according to the various embodiments.

In an embodiment, other patterns can be achieved while forming the SRL 926. In an embodiment, a serpentine pattern can be dispensed where the solder bump count allows for a continuous stream of the SRL 926 to be metered onto the land side 918 of the substrate 914.

Figure 10:
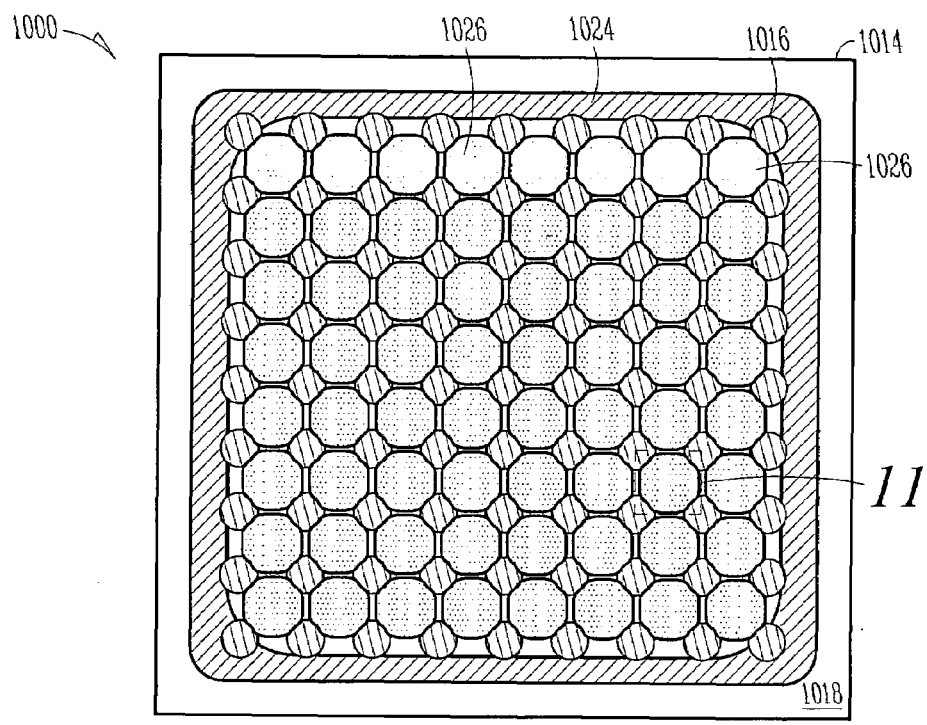
FIG. 10 is a plan of a chip package during processing according to an embodiment.

FIG. 10 is a plan of a chip package 1000 during processing according to an embodiment. The chip package 1000 includes a die (not pictured) that is coupled through a plurality of solder first bumps on the land side thereof, one of which is designated with the reference numeral 1016. In an embodiment, the solder bump 1016 includes any solder as set forth in this disclosure.

The land side 1018 of the substrate 1014 depicts a solder bump array such as a ball-grid array or the like. In an embodiment, the peripheral solder bumps 1016 are contacted with a peripheral ring SRL 1024.

The larger array of the solder bumps 1016 is processed differently to achieve a stress-relief layer. During processing a dispenser (not pictured) ejects a discrete series of compositions upon the land side 1018, which is analogous to a lower surface where the die (not pictured) is on top of a package, such as the die 310 in FIG. 3C that is disposed on top of the package 302. The discrete series of compositions is also referred to by the reference numeral 1026 as an SRL polymer mass 1026 in an embodiment. FIG. 10 depicts flow characteristics of the discrete series of compositions 1026 as it encounters a solder first bump 1016.

Figure 11:
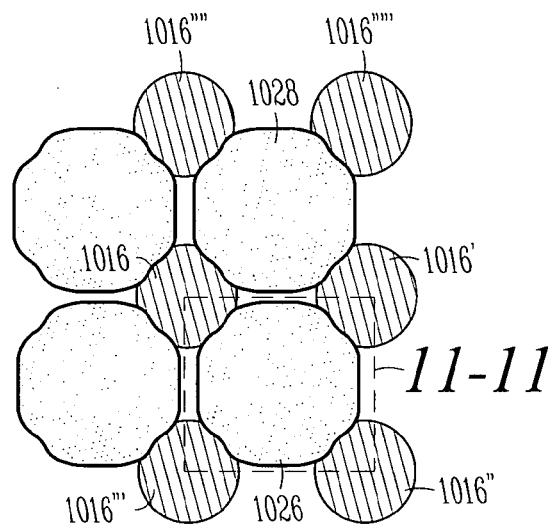
FIG. 11 is a detail section of the chip package depicted in FIG. 10.

FIG. 11 is a detail section 11-11 of the chip package 1000 depicted in FIG. 10. The chip package 1000 details four solder bumps including a solder first bump 1016, a solder second bump 1016', a solder third bump 1016", and a solder fourth bump 1016'''.

The respective solder first-through-fourth bumps 1016, 1016', 1016", and 1016''' are arrayed around a stress-relief layer 1026 that is referred to as an SRL polymer first mass 1026, in a rectangular pattern 11-11 as also seen in FIG. 11. FIG. 11 depicts the SRL polymer first mass 1026 to be contiguous with only the respective solder first-through-fourth bumps 1016, 1016', 1016", and 1016'''.

FIG. 11 also depicts a solder fifth bump 1016$^{IV}$ and a solder sixth bump 1116$^{V}$ that are contiguous to a portion of the stress-relief layer that is an SRL polymer second mass 1028. The solder fifth bump 1016$^{IV}$ and solder sixth bump 1016$^{V}$ are in a rectangular pattern with the solder first bump 1016 and the solder second bump 1016'. Consequently, the SRL polymer second mass 1028 is contiguous with only the solder first bump 1016, the solder second bump 1016', the solder fifth bump 1016$^{IV}$, and the solder sixth bump 1016$^{V}$.

For claiming purposes, an embodiment can refer to the solder fifth bump 1016$^{IV}$ as a solder third bump, and the solder sixth bump 1016$^{V}$ as a solder fourth bump. This relationship is in reference to the SRL polymer first mass 1026 and the SRL polymer second mass 1028.

Various embodiments are achievable by the permutation of the continuous deposition process and the discrete deposition process. For example, filled polymers are ejected to form an array of SRL polymer masses upon the land side 1018 of the substrate 1014 (FIG. 10). Further according to an embodiment, the height of the stress-relief layer is from about 5% of the solder bump exposed to about 95% thereof according to any of the embodiments set forth in this disclosure.

Figure 12A:
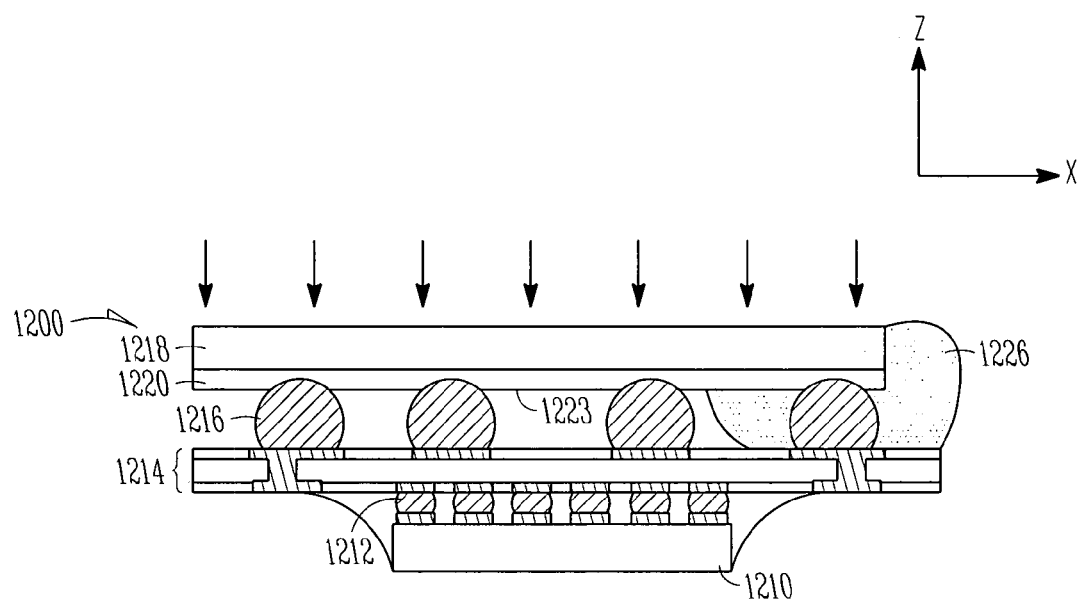
FIG. 12A is a cross-section of a chip package during processing according to an embodiment.

FIG. 12A is a cross-section of a chip package 1200 during processing according to an embodiment. In an embodiment, the chip package 1200 includes chip-scale packaging dimensions.

The chip package 1200 includes a die 1210 that is coupled through a plurality of solder first bumps, one of which is designated with the reference numeral 1212. In an embodiment, the solder first bump 1212 includes any solder as set forth in this disclosure. Although only six solder first bumps 1212 are depicted, they are a reduced number according to an embodiment for clarity of illustration. The solder first 1212 couples the die 1210 to a substrate 1214, which is depicted as a laminated structure. The solder first bump 1212 is disposed on the die side of the substrate 1214. In an embodiment, the substrate 1214 is a second level substrate such as an interposer for a processor.

In an embodiment the chip package 1200 is also bumped on the land side of the substrate 1214 by a plurality of solder second bumps, one of which is designated with the reference numeral 1216. In an embodiment, the solder second bump 1216 includes any solder as set forth in this disclosure.

Although only four solder second bumps 1216 are depicted, they are a reduced number according to an embodiment for clarity of illustration.

In a process embodiment, a press plate 1218 is forced against the plurality of solder second bumps 1216. In an embodiment, a film 1220 is disposed on the same side of the press plate 1218 as the plurality of solder second bumps 1216. In an embodiment, the film 1220 is compressible such that pressure, depicted by the downward vertical arrows, causes the plurality of solder second bumps 1216 to impress the film 1220 and thereby become at least partially embedded into the film 1220.

Figure 12B:
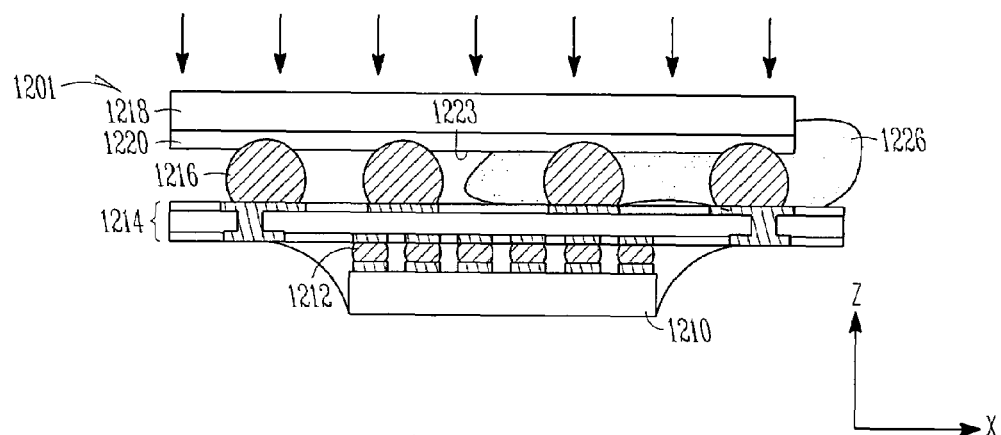
FIG. 12B is a cross-section of the chip package depicted in FIG. 12A during further processing according to an embodiment.

FIG. 12B is a cross-section of the chip package 1200 depicted in FIG. 12A during further processing according to an embodiment. The chip package 1201 is being processed by directing an underfill material 1226 to contact the solder second bump 1216, the film 1220, and the substrate 1214. Because the solder second bump 1216 is partially embedded in the film 1220, the underfill material 1226 does not completely enclose the solder second bump 1216.

Various materials are used as the underfill material 1226, including resins according to an embodiment. In an embodiment, an epoxy is used. In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of any five of the compositions is used. Other polymer compositions can also be used as the underfill material.

After removal of the film 1220, the structure 1201 can be further processed similar to the structure 302 depicted in FIG. 3C.

Figure 13:
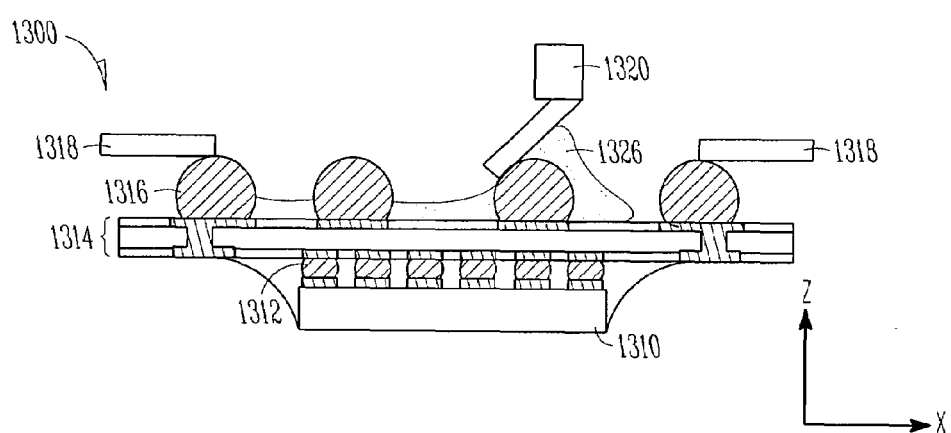
FIG. 13 is a cross-section of a chip package during processing according to an embodiment.

FIG. 13 is cross-section of a chip package during processing according to an embodiment. The chip package 1300 includes a die 1310 that is coupled through a plurality of solder first bumps, one of which is designated with the reference numeral 1312. In an embodiment, the solder first bump 1312 includes any solder as set forth in this disclosure.

Although only six solder first bumps 1312 are depicted, they are a reduced number according to an embodiment for clarity of illustration. The solder first bump 1312 couples the die 1310 to a substrate 1314, which is depicted as a laminated structure. The solder first bump 1312 is disposed on the die side of the substrate 1314. In an embodiment, the chip package 1300 is also bumped on the land side of the substrate 1314 by a plurality of solder second bumps, one of which is designated with the reference numeral 1316. In an embodiment, the solder second bump 1316 includes any solder as set forth in this disclosure.

Although only four solder second bumps 1316 are depicted, they are a reduced number according to an embodiment for clarity of illustration.

In a process embodiment, an open stencil 1318 is placed against the plurality of solder second bumps 1316. A squeegee 1320 is passed across the plurality of solder second bumps 1316 and drives an underfill material 1326 to contact the solder second bump 1316 and the substrate 1314. The underfill material 1326 partially embeds in the solder second bump 1316 to form an SRL. Further processing can be similar to processing the structure 302 as depicted in FIG. 3C.

Figure 14:
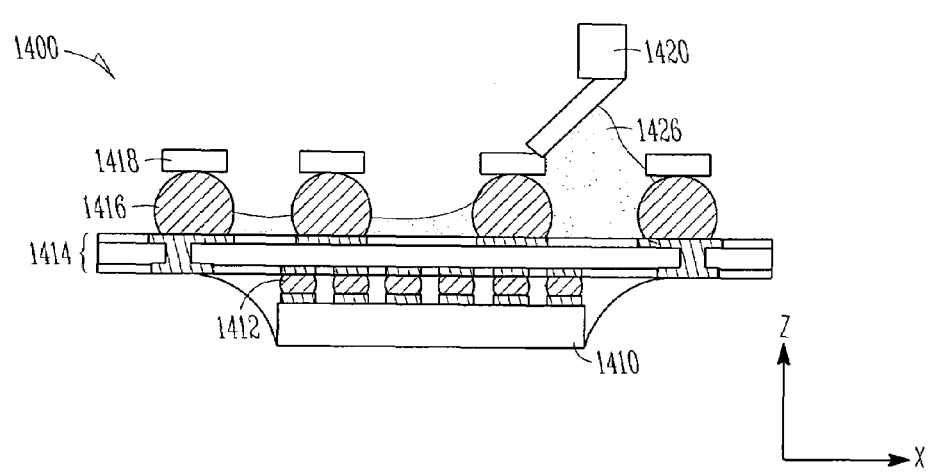
FIG. 14 is a cross-section of a chip package during processing according to an embodiment.

FIG. 14 is cross-section of a chip package during processing according to an embodiment. The chip package 1400 includes a die 1410 that is coupled through a plurality of solder first bumps, one of which is designated with the reference numeral 1412. In an embodiment, the solder first bump 1412 includes any solder as set forth in this disclosure. Although only six solder first bumps 1412 are depicted, they are a reduced number according to an embodiment for clarity of illustration. The solder first bump 1412 couples the die 1410 to a substrate 1414, which is depicted as a laminated structure. The solder first bump 1412 is disposed on the die side of the substrate 1414. In an embodiment the chip package 1400 is also bumped on the land side of the substrate 1414 by a plurality of solder second bumps, one of which is designated with the reference numeral 1416. In an embodiment, the solder second bump 1416 includes any solder as set forth in this disclosure. Although only four solder second bumps 1416 are depicted, they are a reduced number according to an embodiment for clarity of illustration.

In a process embodiment, a patterned stencil 1418 is placed against the plurality of solder second bumps 1416. A squeegee 1420 is passed across the plurality of solder second bumps 1416 and drives an underfill material 1426 to contact the solder second bump 1416 and the substrate 1414. The underfill material 1426 partially embeds in the solder second bump 1416 to form an SRL. Further processing can be similar to processing the structure 302 as depicted in FIG. 3C.

Figure 15:
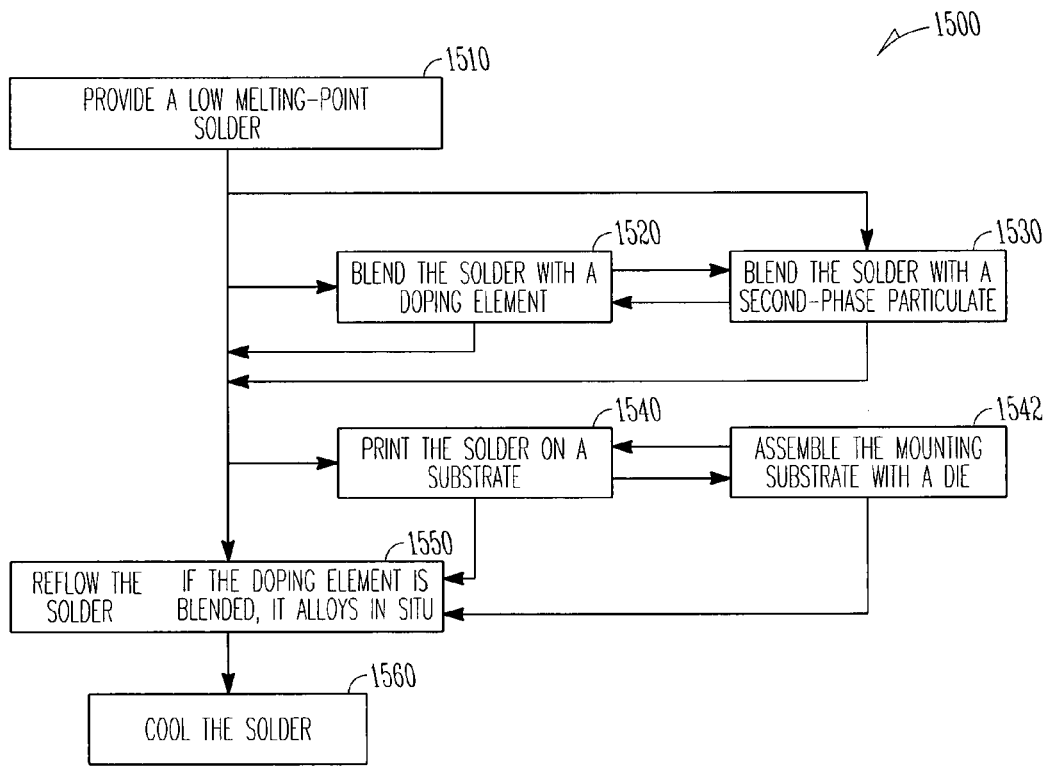
FIG. 15 is a process flow diagram according to an embodiment.

FIG. 15 is a process flow diagram 1500 according to an embodiment.

At 1510, the process includes providing a solder or according to any of the embodiments set forth in this disclosure. In an embodiment, the process flow terminates at 1510.

At 1520, a process further includes blending the solder with a doping element. By way of non-limiting example the first solder 102 (FIG. 1) or the second solder 102 is blended with any of the doping elements set forth in this disclosure. In an embodiment, blending includes pre-alloying. In an embodiment, blending includes non-alloying blending to achieve a discrete presence of the doping element until further processing such as by in situ alloying. In an embodiment, the process flow terminates at 1520. In an embodiment, the process flow originates and terminates at 1520.

At 1530, the process flow includes blending the solder with a second-phase particulate. By way of non-limiting example the second-phase particulate is the first particulate 104 and/or the second particulate 106 (FIG. 1) according to any of the embodiments set forth in this disclosure. In an embodiment, the process flow terminates at 1530. In an embodiment, the process flow originates and terminates at 1530.

In an embodiment the process flow includes both processes 1520 and 1530.

At 1540, the process flow includes printing the solder on a substrate. In an embodiment, the process flow terminates at 1540. In an embodiment, the process flow originates and terminates at 1540.

At 1542, the process flow includes assembling a mounting substrate with a die. In an embodiment, the process flow terminates at 1542. In an embodiment, the process flow originates and terminates at 1542.

At 1550, the solder is reflowed. By way of non-limiting example, where the solder is blended but not pre-alloyed with the doping element, the doping element alloys in situ with the solder. In an embodiment, the process flow terminates at 1550. In an embodiment, the process flow originates and terminates at 1550.

At 1560, the process flow includes cooling the solder.

Figure 16:
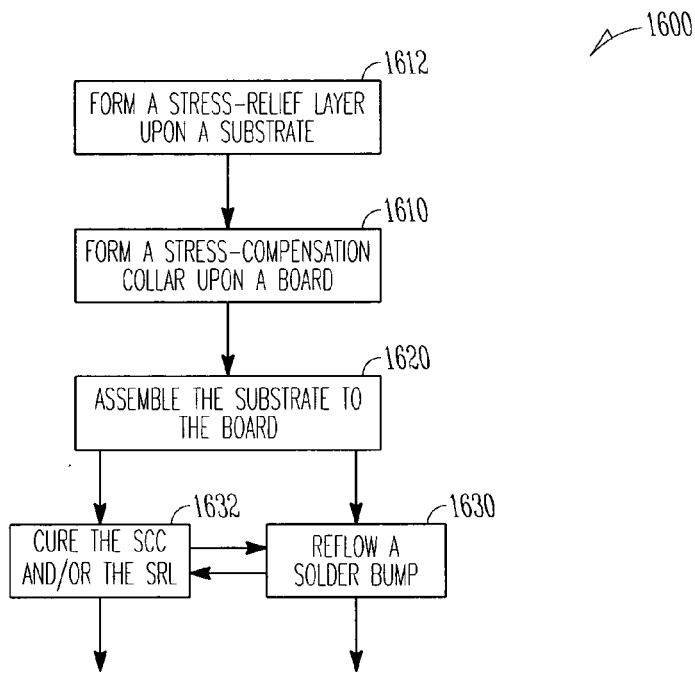
FIG. 16 is a process flow diagram according to an embodiment.

FIG. 16 is a process flow diagram 1600 according to an embodiment.

At 1610, the process includes forming a stress-compensation collar upon a board. By way of non-limiting example, an SCC 329 (FIG. 3D) is formed by pushing a solder first bump 316 (FIG. 3C) through a polymer SCC precursor 328. In an embodiment the process terminates at 1610.

At 1612, the process optionally includes forming a stress-relief layer upon a substrate. By way of non-limiting example, an SRL 324 (FIG. 3B) is formed by ejecting a substantially continuous SRL mass upon the substrate 314. In an embodiment, a series of discrete polymer masses 1026 (FIG. 10) is formed upon the substrate 1014 lower surface 1018. In an embodiment the process advances from 1612 and terminates at 1610.

At 1620, the process includes assembling the substrate to the board. In an example, the substrate is an interposer and the board is a motherboard. In an embodiment, the substrate is assembled without the presence of an SRL. In an embodiment the process terminates at 1620.

At 1630, the process includes reflowing a solder first bump that abuts the SCC. In an embodiment, the process includes a combination of curing (process 1632) at least the SCC and/or curing the SRL, and reflowing a solder first bump. In an embodiment the process terminates at 1630.

At 1632, the process includes curing at least the SCC and/or curing the SRL. In an embodiment, the process includes a combination of curing at least the SCC and additionally curing the SRL, and reflowing (process 1630) a solder first bump. In an embodiment the process terminates at 1632.

In an embodiment, the process includes reflowing a solder first bump, followed in the same or a subsequent thermal process by curing at least the SCC and additionally curing the SRL.

Figure 17:
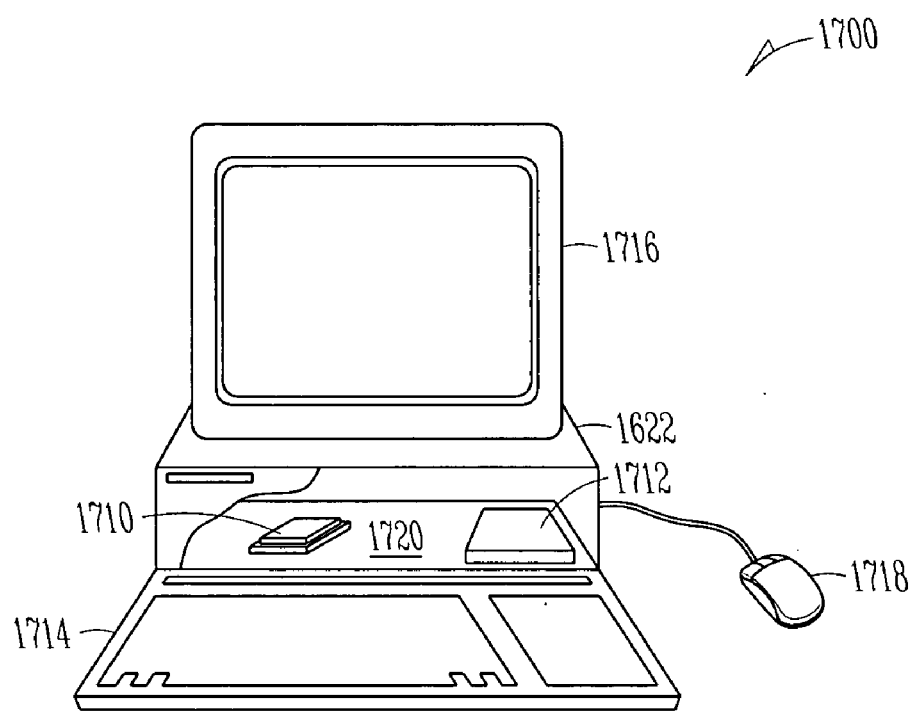
FIG. 17 is a depiction of a computing system according to an embodiment.

FIG. 17 is a depiction of a computing system according to an embodiment. The computing system 1700 includes a solder bump array with an SCC and/or SRL configuration according to an embodiment. One or more of the foregoing embodiments of the SCC and/or SRL configuration may be utilized in a computing system, such as the computing system 1700 of FIG. 17. The computing system 1700 includes at least one processor (not pictured), which is enclosed in a package 1710, a data storage system 1712, at least one input device such as keyboard 1714, and at least one output device such as monitor 1716, for example. The computing system 1700 includes a processor that processes data signals, and may include, for example, a microprocessor, available from Intel Corporation. In addition to the keyboard 1714, the computing system 1700 can include another user input device such as a mouse 1718, for example. The computing system 1700 can be analogous to the substrate 314 (FIG. 3C) and the board 326. Consequently the package 1710 and the board 1720 are analogous to these structures.

For purposes of this disclosure, a computing system 1700 embodying components in accordance with the claimed subject matter may include any system that utilizes a microelectronic device system, which may include, for example, an SCC and/or SRL configuration with a solder that is coupled to data storage such as dynamic random access memory (DRAM), polymer memory, flash memory, and phase-change memory. In this embodiment, the SCC and/or SRL configuration with a solder is coupled to any combination of these functionalities by being coupled to a processor. In an embodiment, however, an SCC and/or SRL configuration with a solder set forth in this disclosure is coupled to any of these functionalities. For an example embodiment, data storage includes an embedded DRAM cache on a die. Additionally in an embodiment, the SCC and/or SRL configuration with a solder that is coupled to the processor (not pictured) is part of the system with an SCC and/or SRL configuration with a solder that is coupled to the data storage of the DRAM cache. Additionally in an embodiment, an SCC and/or SRL configuration with a solder is coupled to the data storage 1712.

In an embodiment, the computing system can also include a die that contains a digital signal processor (DSP), a micro controller, an application specific integrated circuit (ASIC), or a microprocessor. In this embodiment, the SCC and/or SRL configuration with a solder is coupled to any combination of these functionalities by being coupled to a processor. For an example embodiment, a DSP (not pictured) is part of a chipset that may include a stand-alone processor (in package 1710) and the DSP as separate parts of the chipset on the board 1720. In this embodiment, an SCC is coupled to the DSP, and a separate SCC and/or SRL configuration with a solder may be present that is coupled to the processor in package 1710. Additionally in an embodiment, an SCC and/or SRL configuration with a solder is coupled to a DSP that is mounted on the same board 1720 as the package 1710. It can now be appreciated that the SCC and/or SRL configuration with a solder can be combined as set forth with respect to the computing system 1700, in combination with an SRL as set forth by the various embodiments of this disclosure and their equivalents.

It can now be appreciated that embodiments set forth in this disclosure can be applied to devices and apparatuses other than a traditional computer. For example, a die can be packaged with an embodiment of the SCC and/or SRL configuration with a solder, and placed in a portable device such as a wireless communicator or a hand-held device such as a personal data assistant and the like. Another example is a die that can be packaged with an embodiment of the SCC and/or SRL configuration with a solder and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   mating a microelectronic die substrate to a board, wherein the substrate includes an upper surface, a lower surface, and a solder first bump disposed on the lower surface, wherein the solder first bump is selected from:
      $36\% \leq $ indium $ \leq 63\%$; $28\% \leq $ tin $ \leq 48\%$; and $2\% \leq $ bismuth $26\%$;
      $42\% \leq $ bismuth $ \leq 62\%$; $19\% \leq $ tin $ \leq 42\%$; and $7\% \leq $ indium $28\%$;
      $33\% \leq $ indium $ \leq 67\%$; $32\% \leq $ bismuth $ \leq 67\%$; and $0.1\% \leq $ tin $ \leq 20\%$;
      $52\% \leq $ indium $ \leq 54\%$ indium; $0.01\% \leq $ zinc $ \leq 2\%$; and $46\% \leq $ tin $ \leq 48\%$; or
      $33\% \leq $ indium $ \leq 67\%$; $32\% \leq $ bismuth $ \leq 67\%$; and $0.1\% \leq $ zinc $ \leq 1\%$; and
   forming a stress-compensation collar (SCC) on the board during mating the die and the board, wherein the SCC abuts the solder first bump.

2. The process of claim 1, wherein forming the SCC includes embedding the solder first bump into the SCC to a depth range from about 5 percent embedded to about 95 percent embedded.

3. The process of claim 1, further including reflowing the solder first bump.

4. The process of claim 1, further including:
   reflowing the solder first bump; and
   curing the SCC.

5. The process of claim 1, wherein forming an SCC includes dispensing an SCC mass on the board, wherein the SCC mass includes a plurality of spaced-apart spots.

6. The process of claim 1, wherein mating includes mating through an uncured organic composition that includes a non-fugitive element in the composition, and wherein the composition includes at least one material selected from an epoxy solder paste, an epoxy flux, and combinations thereof.

7. The process of claim 1, wherein mating includes mating through an uncured organic composition that includes a non-fugitive element in the composition, and wherein the composition includes at least one material selected from a resin-containing flux, a cyanate ester-containing flux, a polyimide-containing flux, a polybenzoxazole-containing flux, a polybenzimidazole-containing flux, a polybenzothiazole-containing flux, a polymer-solder-flux paste, and combinations thereof.

8. The process of claim 1, wherein mating includes mating through an uncured organic composition that includes a non-fugitive element in the composition, and wherein the composition includes at least one material selected from a paste, a solder paste, an epoxy-containing solder paste, a resin-containing paste, a cyanate ester-containing paste, a polyimide-containing paste, a polybenzoxazole-containing paste, a polybenzimidazole-containing paste, a polybenzothiazole-containing paste, a flux, and combinations thereof.

9. The process of claim 1, wherein forming an SCC includes dispensing a single SCC mass on the board.

10. The process of claim 1, before mating the process including:
    forming a stress-relief layer (SRL) upon the substrate lower surface, wherein the SRL partially embeds the solder first bump.

11. The process of claim 1, further including:
    forming an SRL upon the substrate lower surface, wherein the SRL partially embeds the solder first bump; and
    reflowing the solder first bump.

12. The process of claim 1, further including:
    forming an SRL upon the substrate lower surface, wherein the SRL partially embeds the solder first bump;
    reflowing the solder first bump; and
    curing at least one of the SCC and the SRL.

* * * * *